(12) United States Patent
Eom et al.

(10) Patent No.: US 12,380,961 B2
(45) Date of Patent: Aug. 5, 2025

(54) CONTROL METHOD, SEMICONDUCTOR MEMORY, AND ELECTRONIC DEVICE

(71) Applicant: CHANGXIN MEMORY TECHNOLOGIES, INC., Hefei (CN)

(72) Inventors: Yoonjoo Eom, Hefei (CN); Lin Wang, Hefei (CN); Zhiqiang Zhang, Hefei (CN); Yuanyuan Gong, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 186 days.

(21) Appl. No.: 18/155,632

(22) Filed: Jan. 17, 2023

(65) Prior Publication Data

US 2023/0307082 A1 Sep. 28, 2023

Related U.S. Application Data

(63) Continuation of application No. PCT/CN2022/094333, filed on May 23, 2022.

(30) Foreign Application Priority Data

Mar. 25, 2022 (CN) .......................... 202210307306.6

(51) Int. Cl.
G11C 29/46 (2006.01)
G11C 29/12 (2006.01)
G11C 29/38 (2006.01)

(52) U.S. Cl.
CPC .......... *G11C 29/46* (2013.01); *G11C 29/1201* (2013.01); *G11C 29/38* (2013.01)

(58) Field of Classification Search
CPC ...... G11C 29/46; G11C 29/1201; G11C 29/38
USPC ......................................................... 365/201
See application file for complete search history.

(56) References Cited

U.S. PATENT DOCUMENTS

| 7,707,469 | B2 | 4/2010 | Lee |
| 8,804,448 | B2 | 8/2014 | Park |
| 10,361,699 | B2 | 7/2019 | Lee et al. |
| 2005/0007835 | A1 | 1/2005 | Lee |

(Continued)

FOREIGN PATENT DOCUMENTS

| CN | 103378826 A | 10/2013 |
| CN | 103780257 A | 5/2014 |

(Continued)

OTHER PUBLICATIONS

JP notice of reasons for refusal in application No. 2022-549059, mailed on Apr. 16, 2024.

(Continued)

*Primary Examiner* — Amir Zarabian
*Assistant Examiner* — Daniel J King
(74) *Attorney, Agent, or Firm* — Syncoda LLC; Feng Ma

(57) ABSTRACT

An impedance control strategy for a Data Mask Pin (DM pin) in a preset test mode is provided, so that the impedance of the DM pin in the preset test mode may be defined. In addition, the relation between a control signal configured to control whether to enable the DM pin in a Double Data Rate 5 SDRAM (DDR5) and a control signal configured to control whether the DM pin is a test object in a Package Output Driver Test Mode (PODTM) is specified. The impedance of the DM pin may be tested in the preset test mode.

20 Claims, 12 Drawing Sheets

(56) References Cited

U.S. PATENT DOCUMENTS

| | | | |
|---|---|---|---|
| 2005/0226080 A1* | 10/2005 | Lee | G11C 29/50008 |
| | | | 365/230.03 |
| 2006/0262611 A1 | 11/2006 | Lee | |
| 2007/0070717 A1 | 3/2007 | Kim | |
| 2007/0204185 A1 | 8/2007 | Ogura | |
| 2007/0291575 A1 | 12/2007 | Lee | |
| 2008/0052571 A1 | 2/2008 | Lee | |
| 2008/0143377 A1* | 6/2008 | Cho | H03K 19/0005 |
| | | | 326/30 |
| 2008/0303546 A1 | 12/2008 | Millar | |
| 2009/0059680 A1 | 3/2009 | Lee | |
| 2009/0122850 A1 | 5/2009 | Lee | |
| 2010/0054053 A1 | 3/2010 | Lee | |
| 2011/0102091 A1 | 5/2011 | Yeric | |
| 2011/0164464 A1 | 7/2011 | Sawada | |
| 2011/0242918 A1 | 10/2011 | Jeong | |
| 2011/0267911 A1 | 11/2011 | Jung | |
| 2012/0239337 A1 | 9/2012 | Matsuo | |
| 2013/0049875 A1 | 2/2013 | Shiga | |
| 2013/0271196 A1 | 10/2013 | Cao | |
| 2013/0286759 A1 | 10/2013 | Park | |
| 2014/0286109 A1 | 9/2014 | Yokou | |
| 2014/0298125 A1 | 10/2014 | Devadze et al. | |
| 2015/0016200 A1 | 1/2015 | Cha et al. | |
| 2015/0084668 A1 | 3/2015 | Yun | |
| 2016/0071616 A1 | 3/2016 | Jeong | |
| 2016/0204782 A1 | 7/2016 | Lee | |
| 2017/0331476 A1 | 11/2017 | Cho et al. | |
| 2019/0052268 A1 | 2/2019 | Lee et al. | |

FOREIGN PATENT DOCUMENTS

| | | | |
|---|---|---|---|
| CN | 104113331 | A | 10/2014 |
| CN | 102072781 | B | 2/2015 |
| CN | 106330149 | A | 1/2017 |
| CN | 106372539 | A | 2/2017 |
| CN | 107393576 | A | 11/2017 |
| CN | 109390011 | A | 2/2019 |
| JP | 2005039549 | A | 2/2005 |
| JP | 2009026359 | A | 2/2009 |
| JP | 2009276174 | A | 11/2009 |
| JP | 2013534014 | A | 8/2013 |
| JP | 2018200739 | A | 12/2018 |
| KR | 20070047931 | A | 5/2007 |
| KR | 20120040775 | A | 4/2012 |
| KR | 20180041822 | A | 4/2018 |
| KR | 20190120952 | A | 10/2019 |

OTHER PUBLICATIONS

Micron Technology, Inc, "DDR5 SDRAM, Product Core Data Sheet", DDR5 SDRAM Features, 2021. 10, the whole document. 529 pages.

Hae-Kang Jung et al, "A 4.35Gb/s/pin LPDDR4 I/O Interface with Multi-VOH Level, Equalization Scheme, and Duty-Training Circuit for Mobile Applications", 2015 Symposium on VLSI Circuits Digest of Technical Papers, 2015. 06, the whole document. 2 pages.

First Office Action of the Korean application No. 10-2022-7027987, issued on Jan. 29, 2024. 14 pages with English translation.

First Office Action of the Korean application No. 10-2022-7028280, issued on Jan. 29, 2024. 12 pages with English translation.

First Office Action of the Korean application No. 10-2022-7028352, issued on Jan. 29, 2024. 12 pages with English translation.

US office action in U.S. Appl. No. 18/155,124, mailed on Sep. 11, 2024.

Notice of Final Rejection of the Korean application No. 10-2022-7028280, issued on Oct. 25, 2024. 10 pages with English translation.

Notice of Final Rejection of the Korean application No. 10-2022-7027987, issued on Oct. 25, 2024. 10 pages with English translation.

Notice of Final Rejection of the Korean application No. 10-2022-7028352, issued on Oct. 25, 2024. 10 pages with English translation.

Notice of Allowance of the U.S. Appl. No. 18/156,133, issued on Nov. 7, 2024. 33 pages.

Notice of Allowance of the U.S. Appl. No. 18/155,124, issued on Nov. 27, 2024. 8 pages.

Request for the Submission of an Opinion of the Korean application No. 10-2022-7027987, issued on Apr. 17, 2025, 22 pages with English translation.

Notice of Allowance of the Korean application No. 10-2025-7013401, issued on May 13, 2025. 7 pages with English abstract.

* cited by examiner

S101

In response to that a semiconductor memory is in a preset test mode, when a fourth Operand (OP) in a first Mode Register (MR) is in a first state, an impedance of a Data Mask (DM) pin is controlled to be a first value according to a third OP in a third MR; or when the fourth OP in the first MR is in a second state, the impedance of the DM pin is controlled to be a second value

CONTROL METHOD, SEMICONDUCTOR MEMORY, AND ELECTRONIC DEVICE

CROSS-REFERENCE TO RELATED APPLICATIONS

This is a continuation of International Patent Application No. PCT/CN2022/094333 filed on May 23, 2022, which claims priority to Chinese Patent Application No. 202210307306.6 filed on Mar. 25, 2022. The disclosures of the above-referenced applications are hereby incorporated by reference in their entirety.

BACKGROUND

A Dynamic Random Access Memory (DRAM) is a semiconductor memory device commonly used in computers, at least having a data pin and a Data Mask (DM) pin. Herein, the data pin has dual functions of data writing and data reading, and the DM pin is configured to receive an input mask signal of the write data and shield unnecessary input data during the write operation, and only supports the data writing function. In the fifth edition of the memory specification (alternatively referred to as 5th Double Data Rate SDRAM (DDR5)), some test modes need to test the impedance of the DM pin or the data pin.

SUMMARY

The present disclosure relates to the technical field of semiconductor memories, in particular to a control method, a semiconductor memory and an electronic device.

In a first aspect of the present disclosure, there is provided a control method, applied to a semiconductor memory. The semiconductor memory may include a DM pin, and the DM pin may be configured to receive an input mask signal of write data. The method may include the following operations.

In response to that the semiconductor memory is in a preset test mode, when a fourth Operand (OP) in a first Model Register (MR) is in a first state, an impedance of the DM pin is controlled to be a first value according to a third OP in a third MR; or when the fourth OP in the first MR is in a second state, the impedance of the DM pin is controlled to be a second value.

Herein, the fourth OP is configured to indicate whether to enable the DM pin, and the third OP is configured to indicate whether the DM pin is a test object in the preset test mode.

In a second aspect of the present disclosure, there is provided a semiconductor memory. The semiconductor memory may include a DM pin, a first MR, a third MR, and a first driver circuit. The first driver circuit is connected with the first MR, the third MR and the DM pin respectively.

The DM pin may be configured to receive an input mask signal of write data.

The first driver circuit may be configured to, in response to that the semiconductor memory is in a preset test mode, control, when a fourth OP in the first MR is in a first state, an impedance of the DM pin to be a first value according to a third OP in the third MR; or control, when the fourth OP in the first MR is in a second state, the impedance of the DM pin to be a second value.

Herein, the fourth OP is configured to indicate whether to enable the DM pin, and the third OP is configured to indicate whether the DM pin is a test object in the preset test mode.

In a third aspect of the present disclosure, there is provided an electronic device, which may include the semiconductor memory described in the second aspect.

BRIEF DESCRIPTION OF THE DRAWINGS

FIG. 1 is a schematic flowchart of a control method according to an embodiment of the present disclosure.

DETAILED DESCRIPTION

Figure 2:
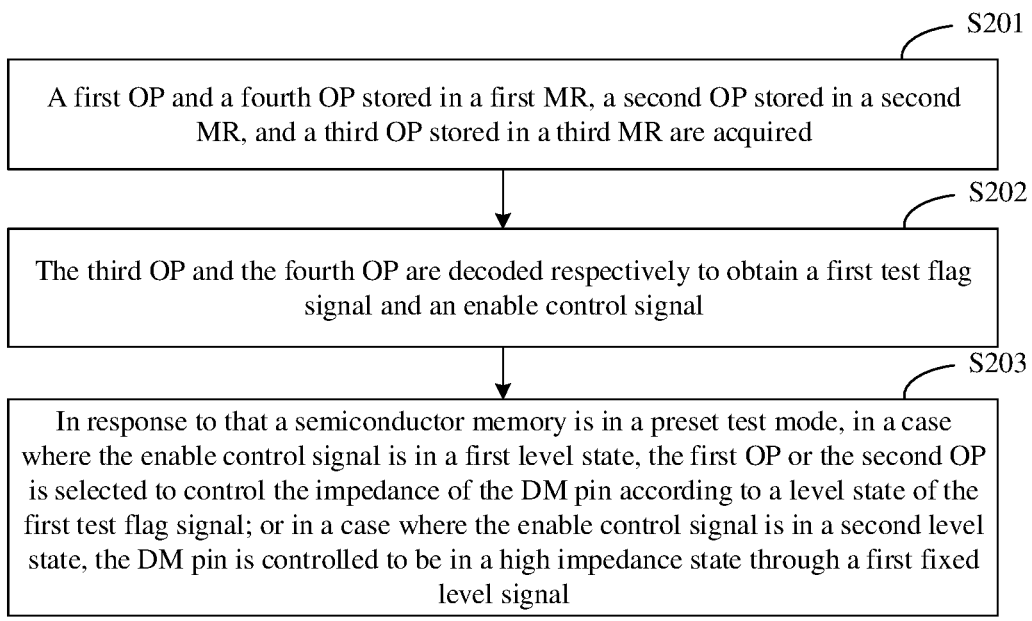
FIG. 2 is a schematic flowchart of another control method according to an embodiment of the present disclosure.

The technical solutions in the embodiments of the present disclosure will be clearly and completely described in conjunction with the drawings in the embodiments of the present disclosure. It should be understood that that the specific embodiments described herein are only used to illustrate the relevant disclosure, but are not intended to limit the disclosure. In addition, it is to be noted that, for the convenience of description, only the parts related to the relevant disclosure are illustrated in the drawings.

Unless otherwise defined, all technical and scientific terms used herein have the same meaning as commonly understood by those skilled in the art of the present disclosure. The terms used herein are only for the purpose of describing the embodiments of the present disclosure and are not intended to limit the present disclosure.

In the following description, reference is made to "some embodiments" which describe a subset of all possible embodiments, but it should be understood that "some embodiments" may be the same or different subsets of all possible embodiments, and may be combined with each other without conflict.

It is to be noted that the terms "first\second\third" involved in the embodiments of the present disclosure are only used to distinguish similar objects, and do not represent a specific order of the objects. It should be understood that the specific order or sequence of "first\second\third" may be interchangeable under the allowable circumstances, so that the embodiments of the disclosure described herein may be implemented in an order other than those illustrated or described herein.

The following are explanations of professional terms involved in the embodiments of the present disclosure and the corresponding relationship of some terms:
Dynamic Random Access Memory (DRAM)
Synchronous Dynamic Random Access Memory (SDRAM)
Double Data Rate SDRAM (DDR)
DDR5 Specification (DDR5 SPEC)
Data Pin (DQ)
Data Mask Pin (DM)
Package Output Driver Test Mode (PODTM)
Mode Register (MR)
Operand (OP)

DDR5 SPEC specifies a new test mode, referred to as the PODTM, which is configured to enable an Output Driver of the DQ or the DM through a host after a chip is packaged, and make other DQs or DMs be in a termination state at the same time, so as to test whether the pull-up impedance of the enabled DQ or the DM in an output driver state meets expectation. However, since the output driver state of the DM is not defined originally, the PODTM may not be adapted to the DM, and circuit processing errors are easily caused.

Based on this, the embodiments of the present disclosure provide the control method. An impedance control strategy for the DM in the preset test mode is provided, so that the impedance of the DM in the preset test mode can be defined. In addition, the relation between a control signal configured to control whether to enable the DM in the DDR5 and a control signal configured to control whether the DM is a test object in the PODTM is specified. The impedance of the DM can be tested in the preset test mode to avoid circuit processing errors.

The embodiments of the present disclosure will be described in detail below with reference to the accompanying drawings.

In an embodiment of the present disclosure, a control method is provided, which may include that: in response to that a semiconductor memory is in a preset test mode, when a DM is selected as a test object, the impedance of the DM is controlled to be a first impedance parameter through a first MR; or when the DM is not the test object, the impedance of the DM is controlled to be a second impedance parameter through a second MR.

It is to be noted that the control method is applied to the semiconductor memory. The semiconductor memory includes the DM and at least one DQ. Herein, the DQ is configured to receive or output data, and has a Write function or a Read function, and is operable in a termination state or an output driver state. The DM is configured to receive an input mask signal of write data, and only has the Write function, and is operable in the termination state.

In the embodiment of the present disclosure, the preset test mode refers to a PODTM introduced in DDR5, and the PODTM is configured to test the impedance of the DM or the at least one DQ after packaging. More specifically, the PODTM allows a host to test the pull-up impedance of the DM or the DQ.

When the DM is selected as the test object in the PODTM, the first MR is allowed to control the impedance of the DM to be the first impedance parameter. Here, since the first MR is configured to indicate the Pull-up impedance of the DQ in the output driver state, the host may test the pull-up impedance related to the output drive of the DM, and there is no need to define the output driver state of the DM.

When the DM is not the test object in the PODTM, the second MR is allowed to control the impedance of the DM to be the second impedance parameter. Here, since the second MR is configured to indicate the impedance in the termination state, the influence of the DM on a test result of the selected test object may be avoided.

In this way, when the semiconductor memory is in the preset test mode, the first MR and the second MR are allowed to directly define the impedance of the DM. The DM does not need to add definition of the output driver state and a related control circuit for the preset test mode to ensure that the preset test mode is adapted to the DM. The impedance of the DM may be tested in the preset test mode to avoid the circuit processing errors.

In some embodiments, the method further includes that: in response to that the semiconductor memory is in the preset test mode, when the DQ is selected as the test object, the impedance of the DQ is controlled to be the first impedance parameter through the first MR; or when the DQ is not the test object, the impedance of the DQ is controlled to be the second impedance parameter through the second MR.

In this way, when the DQ is selected as the test object in the PODTM, the pull-up output driver impedance of the DQ is controlled through the first MR, so as to obtain the test result of the DQ. When the DQ is not taken as the test object in the PODTM, the DQ is controlled to be in the termination state through the second MR, so as to avoid the influence of the DQ on the test result of the selected test object.

In some embodiments, it is determined through the third MR that the semiconductor memory enters the preset test mode and selects the test object; or it is determined through the third MR that the semiconductor memory does not enter the preset test mode.

It should be understood that each MR has a plurality of OP bits to provide corresponding control functions. In the embodiment of the present disclosure, the OP related to the embodiment of the present disclosure in the first MR is referred to as a first OP, the OP related to the embodiment of the present disclosure in the second MR is referred to as a second OP, and the OP related to the embodiment of the present disclosure in the third MR is referred to as a third OP.

That is, in the embodiment of the present disclosure, it is determined through the third OP in the third MR whether the semiconductor memory enters the PODTM, and in the case of entering the PODTM, the test object is selected from the DM and the at least one DQ. Then, the impedance of the selected test object is controlled to be the first impedance parameter (essentially the pull-up output driver impedance) through the first OP in the first MR, and the impedance of an unselected pin is controlled to be the second impedance parameter (essentially the termination impedance) through the second OP in the second MR, so as to obtain the impedance test result of the test object. The DM does not need to add definition of the output driver state and the related control circuit for the preset test mode to ensure that the preset test mode is adapted to the DM. The impedance of the DM may be tested in the preset test mode to avoid the circuit processing errors.

In some embodiments, the standard number of the first MR is 5, and the first OP refers to an OP from the second bit to the first bit stored in the first MR, represented as MR5 OP[2:1]. The standard number of the second MR is 34, and the second OP refers to an OP from the second bit to the 0th bit stored in the second MR, represented as MR34 OP[2:0]. The standard number of the third MR is 61, and the third OP refers to an OP from the 4th bit to the 0th bit stored in the third MR, represented as MR61 OP[4:0]. Here, the standard number refers to the serial number of the MR in the DDR5.

The third OP MR61 OP[4:0], the first OP MR5 OP[2:1], and the second OP MR34 OP[2:0] are specifically described below in conjunction with Tables 1 to 3.

As shown in Table 1, MR61 OP[4:0] is configured to determine whether to enter the PODTM, and to determine the selected pin. It should be understood that the numbers of DMs and DQs are different for the semiconductor memories with different bits. For a 4-bit (X4) memory, there are one low-bit DM (represented as DML) and four low-bit DQs (respectively referred to as DQL0-DQL3). For an 8-bit (X8) memory, there are one low-bit DM (represented as DML) and eight low-bit DQs (respectively referred to as DQL0-DQL7). For a 16-bit (X16) memory, there is one low-bit DM (represented as DML), one high-bit DM (represented as DMU), eight low-bit DQs (respectively referred to as DQL0-DQL7) and eight high-bit DQs (respectively referred to as DQU0-DQU7).

If MR61 OP[4:0]=00000B, it means that the semiconductor memory is not in the PODTM. If a value of MR61 OP[4:0] is any combination other than 00000B in Table 1, it means that the semiconductor memory is in the PODTM. Specifically, if MR61 OP[4:0]=00001B, it means that the test object is the DML. If MR61 OP[4:0]=00010B, it means that the test object is the DMU (only valid for the 16-bit memory). If MR61 OP[4:0]=10000B, it means that the test object is the 0-bit DQ DQL0. Others may be understood by reference, and may not be explained one by one.

TABLE 1

| MR and OP bit | Function | Parameter description |
|---|---|---|
| MR61 OP[4:0] | Package Output Driver Test Mode | $00000_B$: Package Test Disabled (Default)<br>$00001_B$: Package Test DML<br>$00010_B$: Package Test DMU (X16 only)<br>$10000_B$: Package Test DQL0<br>$10001_B$: Package Test DQL1<br>$10010_B$: Package Test DQL2<br>$10011_B$: Package Test DQL3<br>$10100_B$: Package Test DQL4 (X8 and X16 Only)<br>$10101_B$: Package Test DQL5 (X8 and X16 Only)<br>$10110_B$: Package Test DQL6 (X8 and X16 Only)<br>$10111_B$: Package Test DQL7 (X8 and X16 Only)<br>$11000_B$: Package Test DQU0 (X16 Only)<br>$11001_B$: Package Test DQU1 (X16 Only)<br>$11010_B$: Package Test DQU2 (X16 Only)<br>$11011_B$: Package Test DQU3 (X16 Only)<br>$11100_B$: Package Test DQU4 (X16 Only)<br>$11101_B$: Package Test DQU5 (X16 Only)<br>$11110_B$: Package Test DQU6 (X16 Only)<br>$11111_B$: Package Test DQU7 (X16 Only) |

As shown in Table 2, MR5 OP[2:1] is configured to determine the Pull-up Output Driver Impedance of the DQ, so that the impedance of the selected pin is controlled to be the first impedance parameter through MR5 OP[2:1] in the PODTM.

If MR5 OP[2:1]=00B, it means that the pull-up input driver impedance should be RZQ/7, that is, 34 ohms. If MR5 OP[2:1]=01B, it means that the pull-up input driver impedance should be RZQ/6, that is, 40 ohms. If MR5 OP[2:1]=10B, it means that the pull-up input driver impedance should be RZQ/5, that is, 48 ohms. Here, RZQ is the standard resistance value, that is, 240 ohms.

TABLE 2

| MR and OP bit | Function | Parameter description |
|---|---|---|
| MR5 OP[2:1] | Pull-up Output Driver Impedance | $00_B$: RZQ/7 (34)<br>$01_B$: RZQ/6 (40)<br>$10_B$: RZQ/5 (48) |

As shown in Table 3, MR34 OP[2:0] is configured to determine the termination impedance (RTT_PARK) of the DQ or the DM, so that the impedance of the unselected pin is controlled to be the second impedance parameter through MR34 OP[2:0] in the PODTM.

If MR5 OP[2:0]=$001_B$, it means that the termination impedance is RZQ, that is, 240 ohms. If MR5 OP[2:0]=$010_B$, it means that the termination impedance is RZQ/2, that is, 120 ohms. Others may be understood by reference, and may not be explained one by one.

TABLE 3

| MR and OP bit | Function | Parameter description |
|---|---|---|
| MR34 OP[2:0] | RTT_PARK | $000_B$: RTT_OFF default<br>$001_B$: RZQ (240)<br>$010_B$: RZQ/2 (120)<br>$011_B$: RZQ/3 (80)<br>$100_B$: RZQ/4 (60)<br>$101_B$: RZQ/5 (48)<br>$110_B$: RZQ/6 (40)<br>$111_B$: RZQ/7 (34) |

In addition, the unexplained parts in Tables 1 to 3 may be understood with reference to the DDR5 SPEC.

As can be seen from the above, when the DRAM is in the PODTM, the Host is allowed to independently turn on the output driver circuit of the single pin in the DRAM and control other pins to be in the termination state at the same time, so as to perform a characteristic test on the packaged DRAM. In order to enable the PODTM, the host selects the DM or the DQ as a target test object by setting MR61:OP [4:0], and the host also controls the pull-up impedance value of the output driver circuit of the target test object to be 34 ohms by setting MR5 OP[2:1]=00B. Meanwhile, the impedance state of the remaining DMs or DQs in the DRAM is defined as RTT_PARK by MR34 OP[2:0]. It is to be noted that whether to enable the DM is defined by MR5 OP[5]. In addition, if the DM is selected as the target test object in the PODTM, the DRAM may set the impedance of the DM according to MR5 OP[2:1].

In some embodiments, in the case of determining that the semiconductor memory enters the preset test mode, the method further includes the following operations.

The first OP stored in the first MR, the second OP stored in the second MR, and the third OP stored in the third MR are acquired.

Decoding processing is performed on the third OP to obtain a first test flag signal and at least one second test flag signal. Herein, the first test flag signal indicates whether the DM is the test object, and the second test flag signal indicates whether the DQ is the test object.

One of the first OP and the second OP is selected to control the impedance of the DM according to the first test flag signal.

It is to be noted that the first test flag signal is an internal flag signal introduced for the DM to indicate whether the DM is the test object in the PODTM. The second test flag signal is an internal flag signal introduced for the DQ to indicate whether the DQ is the test object in the PODTM. Both the first test flag signal and the second test flag signal are obtained by decoding according to MR61 OP[4:0], see Table 1 above for details.

In order to realize the above mechanism, a specific signal processing method is exemplarily provided below.

In some embodiments, for the DM, the method further includes the following operations.

A first non-test state control signal and a second impedance control signal are determined.

In response to that the semiconductor memory is in the preset test mode, a first impedance control signal is determined based on one of the first OP and the second OP according to the first test flag signal. Alternatively, in response to that the semiconductor memory is not in the preset test mode, the first impedance control signal is determined based on the first non-test state control signal.

One of the first impedance control signal and the second impedance control signal is selected to control the impedance of the DM according to the working state of the semiconductor memory.

It is to be noted that although the functions of the DM and the DQ are different, the DM and the DQ adopt similar signal control principles and circuit structures for the convenience of industrial manufacturing. Specifically, each pin may be regarded as having a read-related attribute and a write-related attribute, and the final impedance of each pin is controlled by an effective signal in a signal corresponding to the read-related attribute and a signal corresponding to the write-related attribute. Therefore, each pin respectively supports a Read function and a Write function under different working scenarios (although the read function of the DM is disabled).

In one case, the first non-test state control signal is configured to indicate the impedance of the DM in a state except the preset test state, and the second impedance control signal is configured to indicate the impedance of the DQ in the output driver state. Here, the impedance of the DM in the state except the preset test state may include the impedance at normal write and the impedance at non-read and non-write, each belonging to the write-related attribute.

At this time, the first non-test state control signal may be understood as the signal corresponding to the write-related attribute, and the second impedance control signal may be understood as the signal corresponding to the read-related attribute. In this way, in the PODTM, the first impedance control signal corresponding to the PODTM is determined according to one of the first OP or the second OP; or in the non-PODTM, the first impedance control signal corresponding to the write-related attribute is determined according to the first non-test state control signal. Then, according to the working state of the semiconductor memory, the impedance of the DM is controlled using the PODTM or the first impedance control signal corresponding to the write-related attribute or the second impedance control signal corresponding to the read-related attribute. The first calibration signal is configured to calibrate a standard resistance value, referring to the following description. In this way, by merging a signal control strategy of the DM in the PODTM into a signal control strategy of the write-related attribute, the impedance control of the PODTM is realized.

Specifically, the working states of the semiconductor memory may include a write state, a read state, a non-read and non-write state, and a preset test mode (PODTM). Herein, (1) when the semiconductor memory is in the write state or the non-read and non-write state or the preset test mode, the impedance of the DM is controlled using the first impedance control signal. (2) When the semiconductor memory is in the read state, the impedance of the DM is controlled using the second impedance control signal.

In another case, the first non-test state control signal is configured to indicate the impedance of the DQ in the output driver state, and the second impedance control signal is configured to indicate the impedance of the DM in the state except the preset test state.

At this time, the first non-test state control signal may be understood as the signal corresponding to the read-related attribute, and the second impedance control signal may be understood as the signal corresponding to the write-related attribute. In this way, in the PODTM, the first impedance control signal corresponding to the PODTM is determined according to one of the first OP or the second OP. Or in the non-PODTM, the first impedance control signal corresponding to the read-related attribute is determined according to the first non-test state control signal. Then, according to the working state of the semiconductor memory, the impedance of the DM is controlled using the PODTM or the first impedance control signal corresponding to the read-related attribute or the second impedance control signal corresponding to the write-related attribute. In this way, by merging the signal control strategy of the DM in the PODTM into a signal control strategy of the read-related attribute, the impedance control of the PODTM is realized.

Specifically, the working states of the semiconductor memory may include the write state, the read state, the non-read and non-write state, and the preset test mode (PODTM). Herein, (1) when the semiconductor memory is in the write state or the non-read and non-write state, the impedance of the DM is controlled using the second impedance control signal. (2) When the semiconductor memory is in the read state or the preset test mode, the impedance of the DM is controlled using the first impedance control signal.

Similarly, a specific signal control method for the DQ is exemplarily provided below.

In some embodiments, for the DQ, the method further includes the following operations.

A third non-test state control signal, a fourth impedance control signal and a fifth impedance control signal are determined.

In response to that the semiconductor memory is in the preset test mode, a third impedance control signal is determined based on one of the first OP and the second OP according to the second test flag signal. Alternatively, in response to that the semiconductor memory is not in the preset test mode, the third impedance control signal is determined based on the third non-test state control signal.

According to the working state of the semiconductor memory, the third impedance control signal and the fifth impedance control signal are selected to control the impedance of the DQ, or the fourth impedance control signal and the fifth impedance control signal are selected to control the impedance of the DQ.

Therefore, in one case, the third non-test state control signal is configured to indicate the impedance of the corresponding DQ in the termination state, and the fourth impedance control signal and the fifth impedance control signal are jointly configured to indicate the impedance of the corresponding DQ in the output driver state. In this way, by merging a signal control strategy of the DQ in the PODTM into the signal control strategy of the write-related attribute, the impedance control of the PODTM is realized.

Specifically, the working states of the semiconductor memory may include the write state, the read state, the non-read and non-write state, and the preset test mode (PODTM). Herein, when the semiconductor memory is in the write state or the non-read and non-write state or the preset test mode, the impedance of the DQ is controlled using the second impedance control signal. When the semiconductor memory is in the read state, the impedance of the DQ is controlled using the fourth impedance control signal and the fifth impedance control signal.

In another case, the third non-test state control signal and the fifth impedance control signal are jointly configured to indicate the impedance of the corresponding DQ in the output driver state, and the fourth impedance control signal is configured to indicate the impedance of the corresponding DQ in the termination state. In this way, by merging the signal control strategy of the DQ in the PODTM into the signal control strategy of the read-related attribute, the impedance control of the PODTM is realized.

Specifically, the working states of the semiconductor memory may include the write state, the read state, the non-read and non-write state, and the preset test mode (PODTM). Herein, (1) when the semiconductor memory is in the write state or the non-read and non-write state, the impedance of the DQ is controlled using the fourth impedance control signal and the fifth impedance control signal. (2) When the semiconductor memory is in the read state or the preset test state, the impedance of the DQ is controlled using the third impedance control signal and the fifth impedance control signal.

It should be understood that the Write function only involves controlling the pull-up impedance (as the termination impedance), and the Read function involves controlling the pull-up impedance and the pull-down impedance at the same time. Since the DM only enables the Write function but not the Read function, the DM only involves the control signal of the pull-up impedance, and the control signal of its pull-down impedance will be set to a fixed level signal to disable the pull-down impedance function. In addition, since the DQ supports the Write function and the Read function at the same time, the DQ may involve the control signal of the pull-up impedance and the control signal of the pull-down impedance. Therefore, the read-related attribute of the DM only involves one signal (the first non-test state control signal or the second impedance control signal), which is configured to control the pull-up impedance. The read-related attribute of the DQ involves two signals (the third non-test state control signal and the fifth impedance control signal, or the fourth impedance control signal and the fifth impedance control signal), which respectively control the pull-up impedance and the pull-down impedance.

Embodiments of the present disclosure provide the control method. When the semiconductor memory is in the preset test mode, the first MR and the second MR related to the DQ are allowed to directly define the impedance of the DM. The DM does not need to add definition of the output driver state and the related control circuit for the preset test mode to ensure that the preset test mode is adapted to the DM. The impedance of the DM may be tested in the preset test mode to avoid circuit processing errors.

Further, for the aforementioned control method, after entering the preset test mode, the impedance state of the DM is determined by an internal flag signal (the first test flag signal). However, the enable control signal configured to indicate whether to enable the DM has been specified in DDR5. That is, the enable control signal may also control the impedance state of the DM, so that the control strategy of the DM may be confused to cause the circuit processing errors. It should be understood that since the DQ in the normal working mode is always in the enabled state, and does not involve the control of enabling or disabling, there is no similar problem.

Based on this, in another embodiment of the present disclosure, referring to FIG. 1, FIG. 1 illustrates a flowchart of a control method according to an embodiment of the present disclosure. As illustrated in FIG. 1, the method may include the following operations.

At S101, in response to that a semiconductor memory is in a preset test mode, when a fourth OP in a first MR is in a first state, the impedance of the DM is controlled to be a first value according to a third OP in a third MR; or when the fourth OP in the first MR is in a second state, the impedance of the DM is controlled to be a second value.

It is to be noted that the control method provided by the embodiment of the present disclosure is applied to the aforementioned semiconductor memory. The semiconductor memory includes the DM, and the DM is configured to receive an input mask signal of write data. The preset test mode is a PODTM.

It is to be noted that the fourth OP is configured to indicate whether to enable the DM, and the third OP is configured to indicate whether the DM is a test object in the preset test mode.

In addition, the first MR is represented as MR5, the third MR is represented as MR61, and the third OP is represented as MR61 OP[4:0], which may refer to the above description for details. In addition, the fourth OP refers to the 5th-bit OP stored in the first MR, and is represented as MR5 OP[5].

In this way, since both the third OP and the fourth OP may affect the impedance state of the DM to avoid the circuit processing errors, the following impedance control strategy is provided: if the fourth OP is in the first state, the impedance of the DM is determined in combination with the state of the third OP, and if the fourth OP is in the second state, the impedance of the DM is directly determined. In this way, the impedance of the DM may be tested in the preset test mode to avoid the circuit processing errors.

In some embodiments, the first state indicates to enable the DM. The first value includes a first impedance parameter and a second impedance parameter. The operation that the impedance of the DM is controlled to be a first value according to a third OP in a third MR may include the following operations.

If the third OP is in a third state, the impedance of the DM is controlled to be the first impedance parameter according to a first OP in the first MR. The third state indicates that the DM is the test object in the preset test mode. If the third OP is in a fourth state, the impedance of the DM is controlled to be the second impedance parameter according to a second OP in a second MR. The fourth state indicates that the DM is not the test object in the preset test mode.

It is to be noted that the semiconductor memory further includes at least one DQ. The DQ is configured to receive or output data, the first OP is configured to indicate that the impedance of the at least one DQ in an output driver state is the first impedance parameter, and the second OP is configured to indicate that the impedance of the at least one DQ in a termination state is the second impedance parameter, which may refer to the above description for details.

Here, the first OP is represented as MR5 OP[2:1], and the second OP is represented as MR34 OP[2:0], which may refer to the above for details. In addition, in DDR5 SPEC, in the case of MR5 OP[5]=1B, it is determined that the fourth OP is in the first state, that is, the DM will be enabled.

In this way, when the DM is selected as the test object in the PODTM, the first OP is allowed to control the impedance of the DM to be the first impedance parameter. Here, since the first OP is configured to indicate the pull-up impedance of the DQ in the output driver state, the host may test the pull-up impedance related to the output drive of the DM, and there is no need to define the output driver state of the DM. When the DM is not the test object in the PODTM, the second OP is allowed to control the impedance of the DM to be the second impedance parameter. Here, since the second OP is configured to indicate the impedance in the termination state, the influence of the DM on a test result of the selected test object may be avoided.

In some embodiments, the second value refers to a high impedance state Hi-Z. The second state indicates not to enable the DM. As illustrated in FIG. 2, the operation that the impedance of the DM is controlled to be a second value includes the following operation.

The DM is controlled to be in the high impedance state Hi-Z through a first fixed level signal.

It is to be noted that in the DDR5 SPEC, in the case where MR5 OP[5]=$0_B$, it is determined that the fourth OP is in the second state, that is, the DM will be disabled. At this time, the DM is in the high impedance state Hi-Z.

In some embodiments, the method further includes the following operations.

At S201, the first OP and the fourth OP stored in the first MR, the second OP stored in the second MR, and the third OP stored in the third MR are acquired.

At S202, the third OP and the fourth OP are decoded respectively to obtain a first test flag signal and an enable control signal.

At S203, in response to that the semiconductor memory is in the preset test mode, in the case where the enable control signal is in a first level state, the first OP or the second OP is selected to control the impedance of the DM according to the level state of the first test flag signal; or in the case where the enable control signal is in a second level state, the DM is controlled to be in the high impedance state through the first fixed level signal.

Here, when the fourth OP is in the first state, the enable control signal is in the first level state. When the fourth OP is in the second state, the enable control signal is in the second level state. When the third OP is in the third state, the first test flag signal is in the first level state. When the third OP is in the fourth state, the first test flag signal is in the second level state.

In the following description, the first level state may be logic "1", and the second level state may be logic "0", but this does not constitute a relevant limitation. In the case of adaptive adjustment of circuit logic, the first level state may be logic "0", and the second level state may be logic "1". Meanwhile, the specific value of the first fixed level state also needs to be determined according to circuit logic adaptability.

Referring to Table 4, the signal control strategy in the preset test mode is described in detail. In Table 4, the first test flag signal is represented by PODTM_EN, the enable control signal is represented by DM_enable, the test enable signal PODTM_EN=1 means that the semiconductor memory enters the PODTM, and X refers to logic "0" or logic "1".

TABLE 4

| PODTM_EN | DM_enable | PODTM_DM_EN | DM | DQ |
|---|---|---|---|---|
| 1 | 0 | X | Hi-Z | Test object: RONpu (MR5 OP[2:1]) Non-test object: RTT_PARK (MR34 OP[2:0]) |
| 1 | 1 | 0 | RTT_PARK (MR34 OP[2:0]) | Test object: RONpu (MR5 OP[2:1]) Non-test object: RTT_PARK (MR34 OP[2:0]) |
| 1 | 1 | 1 | RONpu (MR5 OP[2:1]) | RTT_PARK (MR34 OP[2:0]) |

As shown in Table 4, after entering the PODTM (PODTM_EN=1), there exist the following situations.

(1) For the DM, if the enable control signal DM_enable is logic "0", no matter what state the first test flag signal PODTM_DM_EN is in, the DM is in the high impedance state Hi-Z. For the DQ, the impedance of the DQ selected as the test object is the first impedance parameter, which is specifically controlled by the first OP MR5 OP[2:1]. The impedance of the DQ unselected as the test object is the second impedance parameter, which is specifically controlled by the second OP MR34 OP[2:0].

(2) For the DM, if the enable control signal DM_enable is logic "1", and the first test flag signal PODTM_DM_EN is logic "0", it means that the DM is not the test object, and its impedance is the second impedance parameter RTT_PARK, which is specifically controlled by the second OP MR34 OP[2:0]. For the DQ, the impedance of the DQ selected as the test object is the first impedance parameter, which is specifically controlled by the first OP MR5 OP[2:1]. The impedance of the DQ unselected as the test object is the second impedance parameter, which is specifically controlled by the second OP MR34 OP[2:0].

(3) For the DM, if the enable control signal DM_enable is logic 1, and the first test flag signal PODTM_DM_EN is logic 1, it means that the DM is the test object and its impedance is the first impedance parameter RONpu, which is specifically controlled by the first OP MR5 OP[2:1]. For the DQ, all the DQs are not the test object, so that the impedance of the DQ is the second impedance parameter RTT_PARK, which is specifically controlled by the second OP MR34 OP[2:0].

In this way, the embodiments of the present disclosure provide an impedance control strategy for the DM in the PODTM mode, which may test the impedance of the DM in the PODTM to avoid circuit errors.

In order to realize the above impedance control strategy, a specific signal processing method is exemplarily provided below.

In some embodiments, the method further includes the following operations.

A first non-test state control signal and a second impedance control signal are determined.

In response to that the semiconductor memory is in the preset test mode, a first impedance control signal is output based on one of the first fixed level signal, the first OP and the second OP according to the level state of the first test flag signal and the level state of the enable control signal. Alternatively, in response to that the semiconductor memory is not in the preset test mode, the first impedance control signal is output based on the first non-test state control signal.

One of the first impedance control signal and the second impedance control signal is selected to control the impedance of the DM according to the working state of the semiconductor memory.

In one case, the first non-test state control signal is configured to indicate the impedance of the DM in the state except the preset test state, and the second impedance control signal is configured to indicate the impedance of the DQ in the output driver state. In this way, by merging a signal control strategy of the DM in the PODTM into a signal control strategy of the write-related attribute, the impedance control of the PODTM is realized.

In another case, the first non-test state control signal is configured to indicate the impedance of the DQ in the output driver state, and the second impedance control signal is configured to indicate the impedance of the DM in the state except the preset test state. In this way, by merging the signal control strategy of the DM in the PODTM into a signal control strategy of the read-related attribute, the impedance control of the PODTM is realized.

The embodiments of the present disclosure provide the control method. Since both the third OP and the fourth OP may affect the DM to avoid the circuit processing errors, the following impedance control strategy is provided: if the fourth OP is in the first state, the impedance of the DM is determined in combination with the state of the third OP, and if the fourth OP is in the second state, the impedance of the DM is directly determined. In this way, the relation between the control signal configured to control whether to enable the DM in the DDR5 and the control signal configured to control whether the DM is the test object in the PODTM is specified. The impedance of the DM may be tested in the preset test mode to avoid circuit processing errors.

Figure 3:
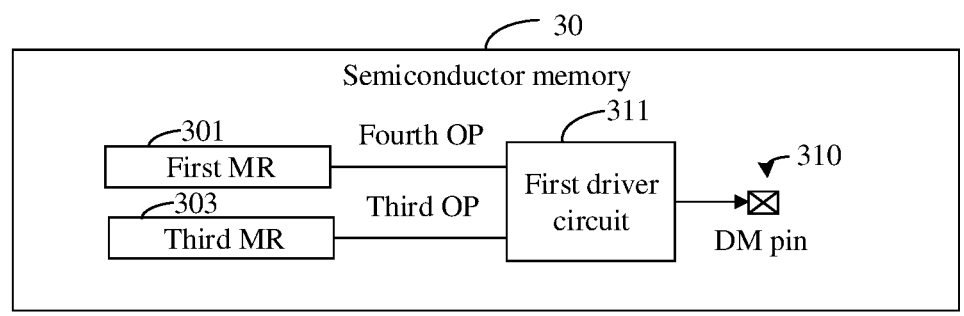
FIG. 3 is a schematic diagram of a structure of a semiconductor memory according to an embodiment of the present disclosure.

In another embodiment of the present disclosure, referring to FIG. 3, FIG. 3 illustrates a schematic structural diagram of a semiconductor memory 30 according to an embodiment of the present disclosure. As illustrated in FIG. 3, the semiconductor memory 30 includes a first MR 301, a third MR 303, a DM 310 and a first driver circuit 311, and the first driver circuit 311 is connected with the first MR 301, the third MR 303 and the DM respectively.

The DM 310 is configured to receive an input mask signal of write data.

The first driver circuit 311 is configured to: in response to that the semiconductor memory 30 is in a preset test mode, control, when a fourth OP in the first MR 301 is in a first state, the impedance of the DM 310 to be a first value according to a third OP in the third MR 303; or control, when the fourth OP in the first MR 301 is in a second state, the impedance of the DM 310 to be a second value.

It is to be noted that the fourth OP is configured to indicate whether to enable the DM, and the third OP is configured to indicate whether the DM is a test object in the preset test mode. The preset test mode may be a PODTM, which allows a host to test the pull-up impedance of the DM or the DQ.

In this way, the impedance of the DM may be tested in the preset test mode to avoid the circuit processing errors.

Figure 4:
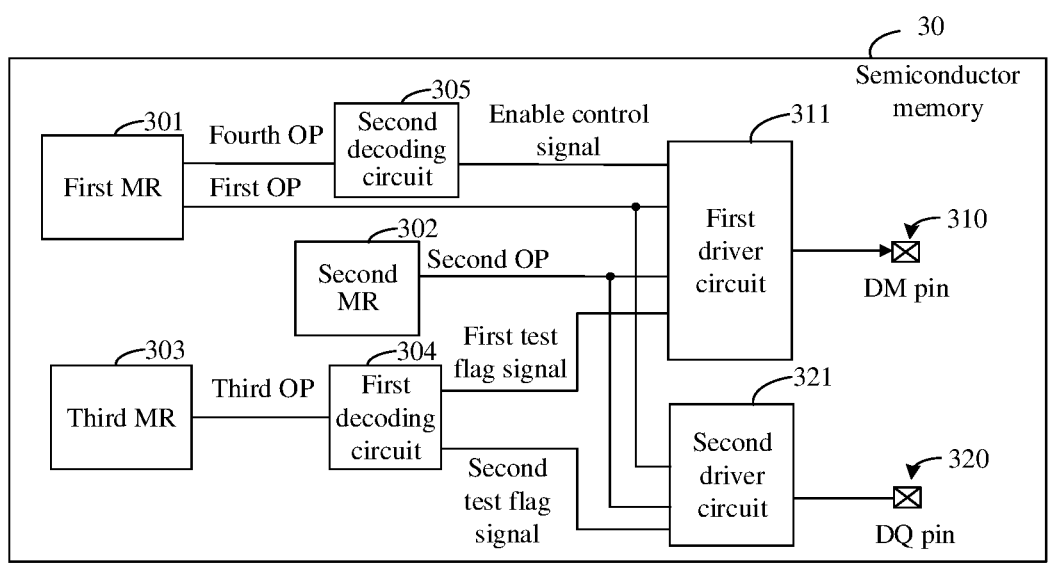
FIG. 4 is a schematic diagram of a structure of another semiconductor memory according to an embodiment of the present disclosure.

In some embodiments, as illustrated in FIG. 4, the semiconductor memory 30 further includes a second MR 302, and the second MR 302 is connected with the first driver circuit 311. The first value includes a first impedance parameter and a second impedance parameter, and the second value refers to a high impedance state.

The first driver circuit 311 is specifically configured to control, in the case where the fourth OP is in the first state and the third OP is in a third state, the impedance of the DM 310 to be the first impedance parameter according to a first OP in the first MR 301; or control, in the case where the fourth OP is in the first state and the third OP is in a fourth state, the impedance of the DM 310 to be the second impedance parameter according to a second OP in the second MR 302; or, control, in the case where the fourth OP is in the second state, the impedance of the DM to be in a high impedance state according to a first fixed level signal.

Here, the first state indicates to enable the DM, and the second state indicates not to enable the DM. The third state indicates that the DM is the test object in the preset test mode. The fourth state indicates that the DM is not the test object in the preset test mode. The semiconductor memory further includes at least one DQ 320. The DQ 320 is configured to receive or output data. The first OP is configured to indicate that the impedance of the at least one DQ 320 in an output driver state is the first impedance parameter, and the second OP is configured to indicate that the impedance of the at least one DQ 320 in a termination state is the second impedance parameter.

It should be understood that only one DQ 320 is illustrated in FIG. 4 for illustration, and there are actually more DQs in the semiconductor memory 30. The embodiments of the present disclosure do not limit the numbers of the DMs 310 and the DQs 320.

In this way, the embodiments of the present disclosure provide the impedance control strategies of the DM and the DQ in the PODTM, so that the impedance of the DM in the PODTM may be tested to avoid the circuit errors.

In some embodiments, the semiconductor memory 30 further includes a first decoding circuit 304 and a second decoding circuit 305.

The first MR 301 is configured to store and output the first OP and the fourth OP.

The second MR 302 is configured to store and output the second OP.

The third MR 303 is configured to store and output the third OP.

The first decoding circuit 304 is configured to receive the third OP, decode the third OP and output a first test flag signal.

The second decoding circuit 305 is configured to receive the fourth OP, decode the fourth OP and output an enable control signal.

The first driver circuit 311 is configured to receive the enable control signal, the first test flag signal, the first fixed level signal, the first OP and the second OP; and control, in the case where the enable control signal is in a first level state, the impedance of the DM 310 based on the first OP or the second OP according to the level state of the first test flag signal when the semiconductor memory 30 is in the preset test mode; or control, in the case where the enable control signal is in a second level state, the DM 310 to be in the high impedance state through the first fixed level signal.

It is to be noted that when the fourth OP is in the first state, the enable control signal is in the first level state. When the fourth OP is in the second state, the enable control signal is in the second level state. When the third OP is in the third state, the first test flag signal is in the first level state. When the third OP is in the fourth state, the first test flag signal is in the second level state.

In some embodiments, as illustrated in FIG. 4, the semiconductor memory 30 further includes at least one second driver circuit 321, and each second driver circuit 321 is connected with the first MR 301, the second MR 302 and one DQ 320.

The second driver circuit 321 is configured to control, if the corresponding DQ 320 is selected as the test object, the impedance of the DM 320 to be the first impedance parameter through the first OP in the first MR 301 when the semiconductor memory 30 is in the preset test mode; or, control, if the corresponding DQ 320 is not the test object, the impedance of the DQ 320 to be the second impedance parameter through the second OP in the second MR 302.

In some embodiments, the third OP in the third MR 303 is also configured to indicate whether the DQ is the test object in the preset test mode. As illustrated in FIG. 4, the second driver circuit 321 is also connected with the first decoding circuit 304.

The first decoding circuit 304 is further configured to perform decoding processing on the third OP and output at least one second test flag signal. Herein, one second test flag signal is configured to indicate whether one DQ is the test object.

The second driver circuit 321 is further configured to receive the corresponding second test flag signal, the first OP and the second OP; and select, in the case where the semiconductor memory 30 enters the preset test mode, one of the first OP and the second OP to control the impedance of the DQ 320 according to the second test flag signal.

It is to be noted that the first test flag signal is an internal flag signal introduced for the DM 310 to indicate whether the DM 310 is the test object in the PODTM. The second test flag signal is an internal flag signal introduced for the DQ 320 to indicate whether the DQ 320 is the test object in the PODTM. Both the first test flag signal and the second test flag signal are obtained by decoding according to the third OP.

As can be seen from the above, in the case of entering the PODTM, the impedance of the selected DM or DQ is the first impedance parameter (essentially the pull-up output driver impedance), and the impedance of the unselected DM or DQ is the second impedance parameter (essentially the termination impedance), so as to obtain the impedance test result of the selected test object. In addition, the impedance of the DM also depends on the enable control signal specified by DDR5. In the case where the enable control signal is valid, the first OP is allowed to control the impedance of the DM to be the first impedance parameter, or the second OP is allowed to control the impedance of the DM to be the second impedance parameter. In the case where the enable control signal is invalid, the impedance of the DM is controlled to be in the high impedance state. In this way, the DM does not need to add definition of the output driver state and the related control circuit for the preset test mode to ensure that the preset test mode is adapted to the DM. The impedance of the DM may be tested in the preset test mode to avoid the circuit processing errors.

It is to be noted that the standard number of the first MR is 5, and the first OP refers to an OP from the second bit to the first bit stored in the first MR, represented as MR5 OP[2:1]. The fourth OP refers to the 5th-bit OP stored in the first MR, and is represented as MR5 OP[5]. The standard number of the second MR is 34, and the second OP refers to an OP from the second bit to the 0th bit stored in the second MR, represented as MR34 OP[2:0]. The standard number of the third MR is 61, and the third OP refers to an OP from the 4th bit to the 0th bit stored in the third MR, represented as MR61 OP[4:0].

Figure 5:
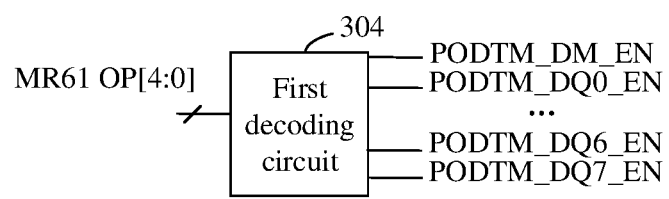
FIG. 5 is a schematic diagram of a structure of a first decoding circuit according to an embodiment of the present disclosure.

As illustrated in FIG. 5, taking a 8-bit (X8) semiconductor memory 30 as an example, the first decoding circuit 304 is configured to receive the third OP MR61 OP[4:0], and decode to obtain the first test flag signal PODTM_DM_EN, the second test flag signal PODTM_DQ0_EN-PODTM_DQ7_EN. Here, the second test flag signals PODTM_DQ0_EN-PODTM_DQ7_EN are respectively configured to indicate whether the DQs DQ0L0-DQL7 are the test objects in the PODTM. It should be understood that a logic circuit in the first decoding circuit 304 is designed according to the aforementioned Table 1.

The specific structure description of the first driver circuit 311 is exemplarily provided below.

In the embodiment of the present disclosure, the semiconductor memory 30 is further configured to determine a first non-test state control signal, a second impedance control signal and a first calibration signal ZQ1_CODE[N−1:0]. The first calibration signal ZQ1_CODE[N−1:0] is configured to calibrate the pull-up resistance value.

Figure 6:
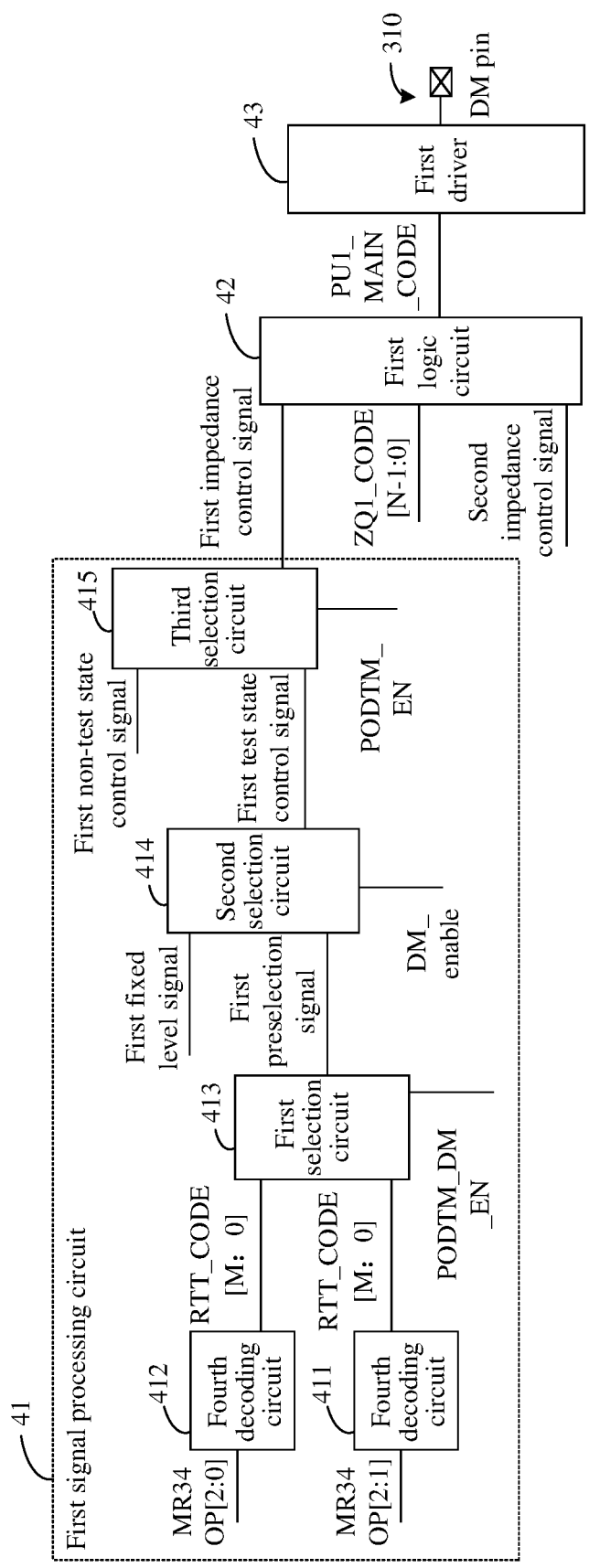
FIG. 6 is a schematic diagram of a structure of a first driver circuit according to an embodiment of the present disclosure.

As illustrated in FIG. 6, the first driver circuit 311 may include a first signal processing circuit 41, a first logic circuit 42, and a first driver 43.

The first signal processing circuit 41 is configured to receive the first test flag signal PODTM_DM_EN, the enable control signal DM_enable, the first fixed level signal, the first OP MR5 OP[2:1], the second OP MR34 OP[2:0] and the first non-test state control signal; and output, based on one of the first fixed level signal, the first OP MR5 OP[2:1] and the second OP MR34 OP[2:0], a first impedance control signal according to the level state of the first test flag signal PODTM_DM_EN and the level state of the enable control signal DM_enable when the semiconductor memory is in the preset test state; or, output, based on the first non-test state control signal, the first impedance control signal when the semiconductor memory is not in the preset test mode.

The first logic circuit 42 is configured to receive the first impedance control signal, the second impedance control signal and the first calibration signal ZQ1_CODE[N−1:0]; and select and logically combine the first impedance control signal, the second impedance control signal and the first calibration signal ZQ1_CODE[N−1:0] to output a first target signal PU1_MAIN_CODE.

The first driver 43 includes a plurality of first impedance units and configured to receive the first target signal PU1_MAIN_CODE, and control the plurality of first impedance units using the first target signal PU1_MAIN_CODE, so as to control the impedance of the DM 310.

It should be understood that the DM 310 only supports the Write function, and does not need to output data to the outside. In the termination state, it only involves the level pull-up function but not the level pull-down function, so that the first driver circuit 311 only has the first impedance control signal and the second impedance control signal which are configured to control the level pull-up function, and does not involve related signals configured to control the level pull-down function. In addition, the pull-up resistance value of each first impedance unit may be a standard resistance value. However, with changes in environmental parameters such as temperature and voltage in the actual working environment, the resistance value of the first impedance unit may also change accordingly. Therefore, the first calibration signal ZQ1_CODE[N−1:0] is configured to calibrate the resistance value of each first impedance unit to the standard resistance value. Here, all the first impedance units share the first calibration signal ZQ1_CODE[N−1:0].

It is to be noted that the first impedance control signal and the second impedance control signal respectively correspond to two attributes, that is, a write-related attribute and a read-related attribute. It should be understood that in the non-PODTM, according to the actual working state, one of the first impedance control signal and the second impedance control signal is valid, which is combined with the first calibration signal ZQ1_CODE[N−1:0] to obtain the first target signal PU1_MAIN_CODE. On the contrary, in the PODTM, the second impedance control signal is fixedly invalid, and the first impedance control signal and the first calibration signal ZQ1_CODE[N−1:0] are combined to obtain the first target signal PU1_MAIN_CODE. Here, the valid signal in the first impedance control signal and the second impedance control signal is configured to enable or disable the level pull-up function of the first impedance unit, and the first calibration signal ZQ1_CODE[N−1:0] is configured to calibrate the resistance value of the first impedance unit to the standard resistance value when the level pull-up function of the first impedance unit is enabled or disabled.

In some embodiments, as illustrated in FIG. 6, the first signal processing circuit 41 includes a third decoding circuit 411, a fourth decoding circuit 412, a first selection circuit 413, a second selection circuit 414 and a third selection circuit 415.

The third decoding circuit 411 is configured to receive the first OP MR5 OP[2:1], decode the first OP MR5 OP[2:1] and output a first decoded signal RONpu_CODE[M:0].

The fourth decoding circuit 412 is configured to receive the second OP MR34 OP[2:0], decode the second OP MR34 OP[2:0] and output a second decoded signal RTT_CODE[M:0].

The first selection circuit 413 is configured to receive the first test flag signal PODTM_DM_EN, the first decoded signal RONpu_CODE[M:0] and the second decoded signal RTT_CODE[M:0]; and select one of the first decoded signal RONpu_CODE[M:0] and the second decoded signal RTT_CODE[M:0] to output a first preselection signal according to the level state of the first test flag signal PODTM_DM_EN.

The second selection circuit 414 is configured to receive the enable control signal DM_enable, the first preselection signal and the first fixed level signal; and select one of the first preselection signal and the first fixed level signal to output a first test state control signal according to the level state of the enable control signal DM_enable.

The third selection circuit 415 is configured to receive the test enable signal PODTM_EN, the first test state control signal and the first non-test state control signal; and select one of the first test state control signal and the first non-test state control signal to output the first impedance control signal according to the level state of the test enable signal PODTM_EN. Herein, the test enable signal is configured to indicate whether the semiconductor memory is in the preset test mode.

It is to be noted that the test enable signal PODTM_EN is configured to indicate whether the semiconductor memory is in the preset test mode PODTM, and is also decoded according to a third control code MR61 OP[4:0]. As shown in Table 1 above, when the value of MR61 OP[4:0] is in other combination forms other than 00000B in Table 1, it indicates that the semiconductor memory is in the preset test mode PODTM, and the test enable signal PODTM_EN is in a first level state (for example, logic "1"). When MR61 OP[4:0]=00000B, it indicates that the semiconductor memory is not in the preset test mode PODTM, and the test enable signal PODTM_EN is in a second level state (for example, logic "0"). Alternatively, it may also be understood that if one of the first test flag signal or the second test flag signal is in the first level state, the test enable signal PODTM_EN is in the first level state. If the first test flag signal and the second test flag signal are in the second level state, the test enable signal PODTM_EN is in the second level state.

It should be understood that a logic circuit in the second decoding circuit 411 is designed according to the aforementioned Table 2, that is, the first decoded signal is configured to represent a resistance value (the first impedance parameter) of the driver impedance Ron, and a logic circuit in the third decoding circuit 412 is designed according to the aforementioned Table 3, that is, the second decoded signal is configured to represent a resistance value (the second impedance parameter) of the termination impedance RTT. In addition, M is a positive integer, and its specific value needs to be determined according to the actual working scenario.

For the first driver circuit 311 illustrated in FIG. 6, according to the different definitions of the first non-test state control signal and the second impedance control signal, there may be two specific implementation modes.

In one implementation mode, the first non-test state control signal is configured to indicate the impedance of the DM in a state except the preset test state, and the second impedance control signal is configured to indicate the impedance of the DQ in the output driver state. That is, by merging the signal control strategy of the DM in the PODTM into the signal control strategy of the write-related attribute, the impedance control of the PODTM is realized.

Figure 7:
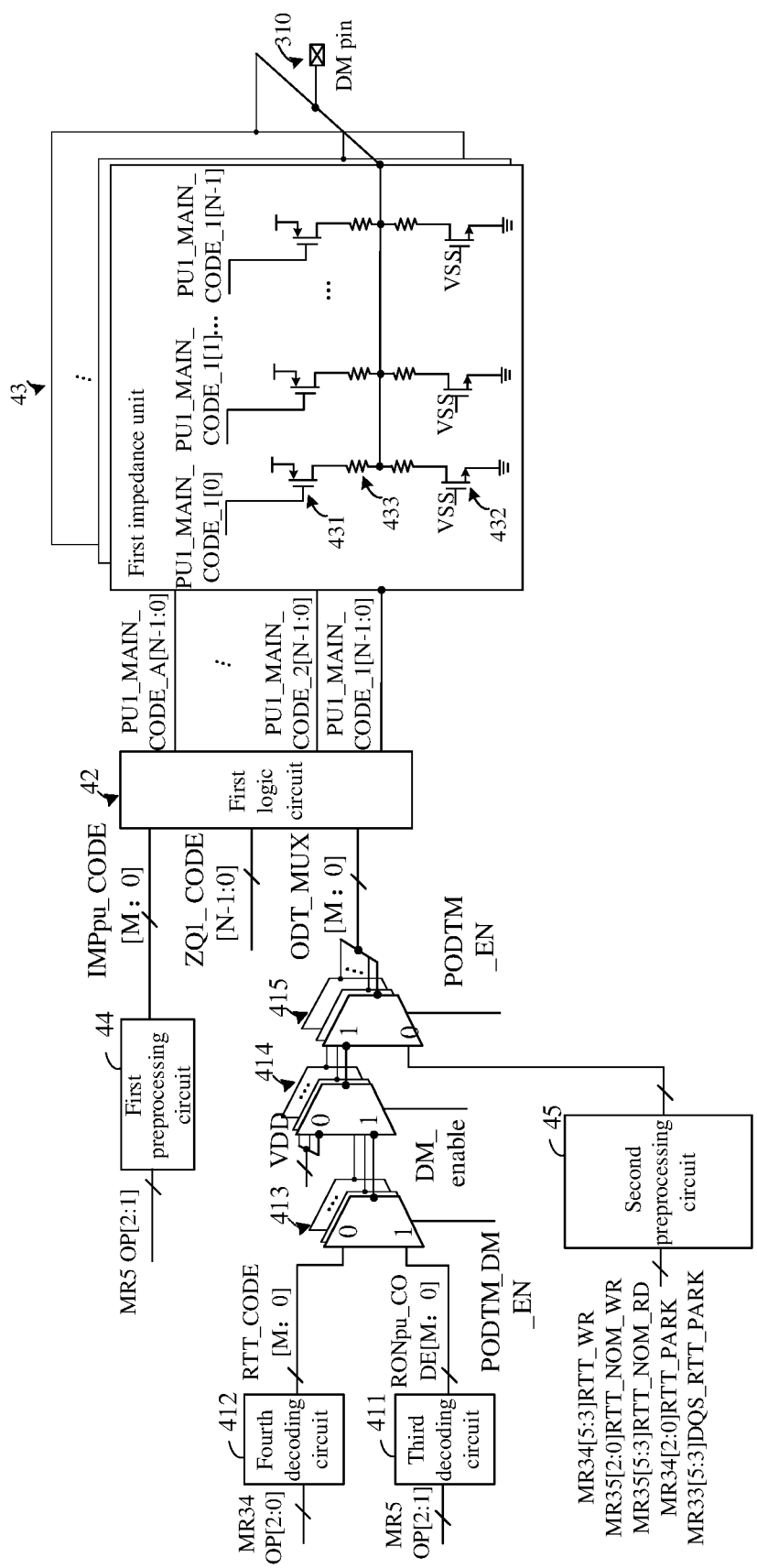
FIG. 7 is a first schematic diagram of a detailed structure of a first driver circuit according to an embodiment of the present disclosure.

Correspondingly, as illustrated in FIG. 7, the first impedance control signal is represented by ODT_MUX[M:0], and the second impedance control signal is represented by IMPpu_CODE[M:0]. Particularly, compared with FIG. 6, the first driver circuit 311 in FIG. 7 further includes a first preprocessing circuit 44 and a second preprocessing circuit 45. The first preprocessing circuit 44 is configured to decode the first OP MR5 OP[2:1] to obtain the second impedance control signal IMPpu_CODE[M:0]. The second preprocessing circuit 45 is configured to determine the first non-test state control signal according to MR34[5:3] involving RTT_WR, MR35[2:0] involving RTT_NOM_WR, MR35[5:3] involving RTT_NOM_RD, MR34[2:0] involving RTT_PARK, and MR33[5:3] involving DQS_RTT_PARK. The specific meanings of the above signals refer to the regulations of DDR5 SPEC, and the signals of the part do not affect the implementation of the non-disclosed embodiments, which will not be described in detail. In addition, in the following description, if the semiconductor memory 30 is in the PODTM, the test enable signal PODTM_EN is logic "1". If the semiconductor memory 30 is not in the PODTM, the test enable signal PODTM_EN is logic "0". If the DM 310 is the test object of the PODTM, the first test flag signal PODTM_DM_EN is logic "1". If the DM 310 is not the test object of the PODTM, the first test flag signal PODTM_DM_EN is logic "0". If the DM 310 is enabled, the enable control signal DM_enable is logic "1". If the DM 310 is disabled, the enable control signal DM_enable is logic "0". The first fixed level signal is represented by VDD, and the first fixed level signal VDD indicates that the level pull-up functions of all the first impedance units are disabled. It should be understood that the specific value of the first fixed level signal depends on the logic principle of the circuit, and may be adjusted according to the corresponding circuit logic.

The working principle of FIG. 7 is explained below in four working scenarios.

The first working scenario is that: the enable control signal DM_enable indicates to enable the DM 310. The semiconductor memory 30 enters the PODTM and the DM 310 is the test object. At this time, since the first test flag signal PODTM_DM_EN is logic "1", the first selection circuit 413 outputs the first decoded signal RONpu_CODE [M:0] to obtain the first preselection signal. Since the enable control signal DM_enable is logic "1", the second selection circuit 414 outputs the first preselection signal to obtain the first test state control signal. Since the test enable signal PODTM_EN is logic "1", the third selection circuit 415 outputs the first test state control signal to obtain the first impedance control signal ODT_MUX[M:0]. As previously described, the second impedance control signal IMPpu_CODE[M:0] in the PODTM is fixedly invalid, so that the first logic circuit 42 actually logically combines the first impedance control signal ODT_MUX[M:0] and the first calibration signal ZQ1_CODE[N−1:0] to obtain the first target signal PU1_MAIN_CODE, thereby controlling the impedance of the DM 310 to be the first impedance parameter. Here, the invalidation of the second impedance control signal IMPpu_CODE[M:0] may be achieved in at least two ways of adding corresponding signal blocking logic in the first preprocessing circuit 44, or adding corresponding signal blocking logic in the first logic circuit 42.

As can be seen from the above, for the first working scenario, the impedance of the DM 310 is actually controlled by the first OP MR5 OP[2:1], and is the first impedance parameter specifically.

The second working scenario is that: the enable control signal DM_enable indicates to enable the DM 310. The semiconductor memory 30 enters the PODTM and the DM 310 is not the test object. At this time, since the first test flag signal PODTM_DM_EN is logic "0", the first selection circuit 413 outputs the second decoded signal RTT_CODE [M:0] to obtain the first preselection signal. Since the enable control signal DM_enable is logic "1", the second selection circuit 414 outputs the first preselection signal to obtain the first test state control signal. Since the test enable signal PODTM_EN is logic "1", the third selection circuit 415 outputs the first test state control signal to obtain the first impedance control signal ODT_MUX[M:0]. As previously described, the second impedance control signal IMPpu_CODE[M:0] in the PODTM is fixedly invalid, so that the first logic circuit 42 actually logically combines the first impedance control signal ODT_MUX[M:0] and the first calibration signal ZQ1_CODE[N−1:0] to obtain the first target signal PU1_MAIN_CODE, thereby controlling the impedance of the DM 310 to be the second impedance parameter.

As can be seen from the above, for the second working scenario, the impedance of the DM 310 is actually controlled by the second OP MR34 OP[2:0], and is the second impedance parameter specifically.

The third working scenario is that: the enable control signal DM_enable indicates not to enable the DM 310. The semiconductor memory 30 enters the PODTM. At this time, since the enable control signal DM_enable is logic "0", the second selection circuit 414 outputs the first fixed level signal VDD to obtain the first test state control signal. Since the test enable signal PODTM_EN is logic "1", the third selection circuit 415 outputs the first test state control signal to obtain the first impedance control signal ODT_MUX [M:0]. As previously described, the second impedance control signal IMPpu_CODE[M:0] in the PODTM is fixedly invalid, so that the first logic circuit 42 actually logically combines the first impedance control signal ODT_MUX [M:0] and the first calibration signal ZQ1_CODE[N−1:0] to obtain the first target signal PU1_MAIN_CODE. Since the first fixed level signal VDD indicates that the level pull-up functions of all the first impedance units are disabled, the first target signal PU1_MAIN_CODE may control the first driver 43 to be in a disconnected state, so that the DM 310 is in the high impedance state Hi-Z.

As can be seen from the above, for the third working scenario, the impedance of the DM 310 is actually controlled by the first fixed level signal VDD, and is the high impedance state Hi-Z specifically.

The fourth working scenario is that: the semiconductor memory 30 does not enter the PODTM. At this time, since the enable control signal PODTM_EM is logic "0", the third selection circuit 415 outputs the first non-test state control signal determined by the second preprocessing circuit 45 to obtain the first impedance control signal ODT_MUX[M:0]. Since the DM 310 only supports the Write function, the second impedance control signal IMPpu_CODE[M:0] in the non-PODTM is invalid and the first impedance control signal ODT_MUX[M:0] is valid, so that the first logic circuit 42 combines the first impedance control signal ODT_MUX[M:0] and the first calibration signal ZQ1_CODE[N−1:0] to obtain the first target signal PU1_MAIN_CODE, thereby controlling the impedance of the DM 310.

As can be seen from the above, for the fourth working scenario, the impedance of the DM 310 is actually controlled by the second preprocessing circuit 45, and depends on the actual requirements.

In another implementation mode, the first non-test state control signal is configured to indicate the impedance of the DQ in the output driver state, and the second impedance control signal is configured to indicate the impedance of the DR except the preset test state. That is, by merging the signal control strategy of the DR in the PODTM into the signal control strategy of the read-related attribute, the impedance control of the PODTM is realized.

Figure 8:
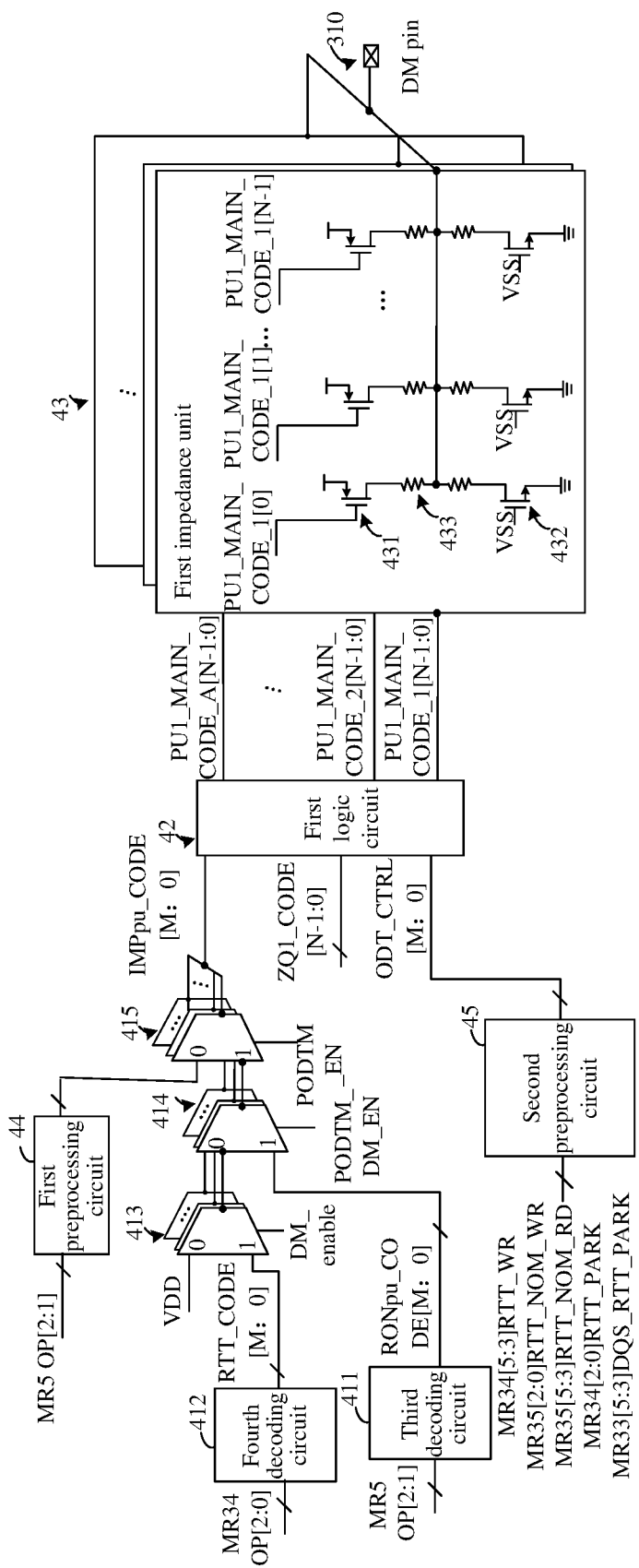
FIG. 8 is a second schematic diagram of a detailed structure of a first driver circuit according to an embodiment of the present disclosure.

Correspondingly, as illustrated in FIG. 8, the first impedance control signal is represented by IMPpu_CODE[M:0], and the second impedance control signal is represented by ODT_CTRL[M:0]. Particularly, compared with FIG. 6, the semiconductor memory 30 in FIG. 8 also includes the first preprocessing circuit 44 and the second preprocessing circuit 45.

Similarly, the working principle of FIG. 8 is explained below in four working scenarios.

The first working scenario is that: the enable control signal DM_enable indicates to enable the DM 310. The semiconductor memory 30 enters the PODTM and the DM 310 is the test object. At this time, since the first test flag signal PODTM_DM_EN is logic "1", the first selection circuit 413 outputs the first decoded signal RONpu_CODE [M:0] to obtain the first preselection signal. Since the enable control signal DM_enable is logic "1", the second selection circuit 414 outputs the first preselection signal to obtain the first test state control signal. Since the test enable signal PODTM_EN is logic "1", the third selection circuit 415 outputs the first test state control signal to obtain the first impedance control signal IMPpu_CODE[M:0]. As previously described, the second impedance control signal ODT_CTRL[M:0] in the PODTM is fixedly invalid, so that the first logic circuit 42 actually logically combines the first impedance control signal IMPpu_CODE[M:0] and the first calibration signal ZQ1_CODE[N−1:0] to obtain the first target signal PU1_MAIN_CODE, thereby controlling the impedance of the DM 310 to be the first impedance parameter.

In this way, for the first working scenario, the impedance of the DM 310 is still controlled by the first OP MR5 OP[2:1], and is the first impedance parameter.

The second working scenario is that: the enable control signal DM_enable indicates to enable the DM 310. The semiconductor memory 30 enters the PODTM and the DM 310 is not the test object. At this time, since the first test flag signal PODTM_DM_EN is logic "0", the first selection circuit 413 outputs the second decoded signal RTT_CODE [M:0] to obtain the first preselection signal. Since the enable control signal DM_enable is logic "1", the second selection circuit 414 outputs the first preselection signal to obtain the first test state control signal. Since the test enable signal PODTM_EN is logic "1", the third selection circuit 415 outputs the first test state control signal to obtain the first impedance control signal IMPpu_CODE[M:0]. As previously described, the second impedance control signal ODT_CTRL in the PODTM is fixedly invalid, so that the first logic circuit 42 actually logically combines the first impedance control signal IMPpu_CODE[M:0] and the first calibration signal ZQ1_CODE[N−1:0] to obtain the first target signal PU1_MAIN_CODE, thereby controlling the impedance of the DM 310 to be the second impedance parameter.

As can be seen from the above, for the second working scenario, the impedance of the DM 310 is actually controlled by the second OP MR34 OP[2:0], and is the second impedance parameter specifically.

The third working scenario is that: the enable control signal DM_enable indicates not to enable the DM 310. The semiconductor memory 30 enters the PODTM. At this time, since the enable control signal DM_enable is logic "0", the second selection circuit 414 outputs the first fixed level signal VDD to obtain the first test state control signal. Since the test enable signal PODTM_EN is logic "1", the third selection circuit 415 outputs the first test state control signal to obtain the first impedance control signal IMPpu_CODE [M:0]. As previously described, the second impedance control signal ODT_CTRL in the PODTM is fixedly invalid, so that the first logic circuit 42 actually logically combines the first impedance control signal IMPpu_CODE[M:0] and the first calibration signal ZQ1_CODE[N−1:0] to obtain the first target signal PU1_MAIN_CODE. Since the first fixed level signal VDD indicates that the level pull-up functions of all the first impedance units are disabled, the first target signal PU1_MAIN_CODE may control the first driver 43 to be in a disconnected state, so that the DM 310 is in the high impedance state Hi-Z.

As can be seen from the above, for the third working scenario, the impedance of the DM 310 is actually controlled by the first fixed level signal VDD, and is the high impedance state Hi-Z specifically.

The fourth working scenario is that: the semiconductor memory 30 does not enter the PODTM. At this time, since the enable control signal PODTM_EM is logic "0", the third selection circuit 415 outputs the first non-test state control signal determined by the first preprocessing circuit 44 to obtain the first impedance control signal IMPpu_CODE[M:0]. Meanwhile, the second preprocessing circuit 45 outputs the second impedance control signal ODT_CTRL[M:0]. As previously described, since the DM 310 only supports the Write function, the first impedance control signal IMPpu_CODE[M:0] in the non-PODTM is invalid and the second impedance control signal ODT_CTRL[M:0] is valid, so that the first logic circuit 42 combines the second impedance control signal ODT_CTRL[M:0] and the first calibration signal ZQ1_CODE[N−1:0] to obtain the first target signal PU1_MAIN_CODE, thereby controlling the impedance of the DM 310.

In this way, for the fourth working scenario, the impedance of the DM 310 is actually controlled by the second preprocessing circuit 45, and specifically depends on the actual requirements.

It is also to be noted that in FIG. 7 and FIG. 8, the "I" symbol marked on a signal path is configured to indicate that there are a plurality of signal paths actually, and only one is drawn for illustration. In other words, each signal in MR34 OP[2:0], MR5 OP[2:1], RONpu_CODE[M:0], RTT_CODE [M:0], IMPpu_CODE[M:0], ZQ1_CODE[N−1:0], ODT_CTRL[M:0], ODT_MUX[M:0], and PU1_MAIN_CODE includes a plurality of sub-signals, and each sub-signal has its own signal path.

The signal processing process in the first driver circuit 311 will be described below with reference to FIG. 7 or FIG. 8.

In some embodiments, as illustrated in FIG. 7 or FIG. 8, each of the first decoded signal RONpu_CODE[M:0], the second decoded signal RTT_CODE[M:0], the first preselection signal, the first fixed level signal, the first test state control signal, the first non-test state control signal and the first impedance control signal includes an (M+1)-bit sub-signal, represented as [M:0]. The first selection circuit 413 includes (M+1) first data selectors, the second selection circuit 414 includes (M+1) second data selectors, and the third selection circuit 415 includes (M+1) third data selectors. Herein, the input end of one first data selector respectively receives a 1-bit sub-signal of the first decoded signal RONpu_CODE[M:0] and a 1-bit sub-signal of the second decoded signal RTT_CODE[M:0], the output end of one first data selector is configured to output a 1-bit sub-signal of the first preselection signal, and the control ends of all the first data selectors receive the first test flag signal PODTM_DM_EN. The input end of one second data selector receives the 1-bit sub-signal of the first preselection signal and a 1-bit sub-signal of the first fixed level signal, the output end of one second data selector is configured to output a 1-bit sub-signal of the first test state control signal, and the control ends of all the second data selectors receive the test enable signal DM_enable. The input end of one third data selector receives the 1-bit sub-signal of the first test state control signal and a 1-bit sub-signal of the first non-test state control signal, the output end of one third data selector is configured to output a 1-bit sub-signal of the first impedance control signal, and the control ends of all the third data selectors receive the test enable signal PODTM_EN. Herein, M is a positive integer.

It is to be noted that the first test state control signal is represented as the first test state control signal [M:0], the first preselection signal is represented as the first preselection signal [M:0], the first fixed level signal is represented as VDD[M:0], the first non-test state control signal is represented as the first non-test state control signal [M:0], and the first impedance control signal is represented as the first impedance control signal [M:0]. In this way, the first first data selector receives RONpu_CODE[0], RTT_CODE[0] and PODTM_DM_EN respectively, and selects one of RONpu_CODE[0] and RTT_CODE[0] to output the first preselection signal [0] according to PODTM_DM_EN. The first second data selector receives the first preselection signal [0], the VDD[0] and DM_enable respectively, and selects one of the first preselection signal [0] and the VDD[0] to output the first test state control signal [0] according to DM_enable. The first third data selector receives the first test state control signal [0], the first non-test state control signal [0] and PODTM_EN respectively, and selects one of the first test state control signal [0] and the first non-test state control signal [0] to output the first impedance control signal [0] according to PODTM_EN. Others may be understood by reference.

In some embodiments, the second impedance control signal includes an (M+1)-bit sub-signal, and the first calibration signal ZQ1_CODE[N−1:0] includes N-bit sub-signals. The first target signal includes A group of sub-signals, and each group of sub-signals includes N-bit sub-signals. The first group of signals in the first target signal are represented as PU1_MAIN_CODE 1[N−1:0], the second group of signals in the first target signal are represented as P PU1_MAIN_CODE 2[N−1:0], and the A group of signals in the first target signal are represented as PU1_MAIN_CODE_A[N−1:0]. The first driver 53 includes A first impedance units, and each first impedance unit is configured to receive a group of sub-signals in the first target signal PU1_MAIN_CODE, that is, the first first impedance unit is configured to receive PU1_MAIN_CODE 1[N−1:0], the second first impedance unit is configured to receive PU1_MAIN_CODE 2[N−1:0] . . . the Ath first impedance unit is configured to receive PU1_MAIN_CODE_A[N−1:0].

Herein, as illustrated in FIG. 7 or FIG. 8, the first logic circuit 42 is specifically configured to determine whether the level pull-up function of the at least one first impedance unit is enabled according to the first impedance control signal and the second impedance control signal; and determine, in the case where the level pull-up function of the ath first impedance unit is enabled, the level state of the ath group of sub-signals in the first target signal PU1_MAIN_CODE according to the first calibration signal, so as to control the resistance value of the ath first impedance unit to be the standard resistance value; or, determine, in the case where the level pull-up function of the ath first impedance unit is disabled, that the ath group of sub-signals in the first target signal PU1_MAIN_CODE are in the first level state (which may be determined according to the actual circuit logic and does not constitute a relevant limitation). Herein, a, N, and A are all integers, a is less than or equal to A, and (M+1) is less than or equal to A.

It should be understood that for the first logic circuit 42, there is only one valid signal between the first impedance control signal and the second impedance control signal. In the case where M+1<A, the 1-bit sub-signal in the valid signal controls whether the level pull-up function of one or more first impedance units is enabled. In addition, the plurality of first impedance units are in a parallel state, and each first impedance unit may provide a standard resistance value RZQ. In this way, if the pull-up impedance of the DM 310 needs to be adjusted to RZQ/2, the level pull-up functions of the two first impedance units are enabled, and the level pull-up functions of the remaining first impedance units are disabled. If the pull-up impedance of the DM 310 needs to be adjusted to RZQ/3, the level pull-up functions of the three first impedance units are enabled, and the level pull-up functions of the remaining first impedance units are disabled. Other situations may be understood by reference.

Exemplarily, in the case where M+1=A=7, assuming that the valid signal between the first impedance control signal and the second impedance control signal is IMPpu_CODE [6:0], then IMPpu_CODE[0] controls the first impedance control signal, IMPpu_CODE[1] controls the second first impedance unit IMPpu_CODE[6] controls the seventh first impedance unit. Specifically, assuming that IMPpu_CODE [6:0]=1111111, the level values of each groups of sub-signals (Seven groups in total) in the first target signal are the same as the level value of the first calibration signal, so that the pull-up resistance values of the seven first impedance units are all RZQ, and the pull-up resistance of the DM 310 is RZQ/7. Assuming that IMPpu_CODE[6:0]=1111000, the level values of the first group of sub-signals to the third group of sub-signals in the first target signal are in the first level state, and the level values of each group of sub-signals in the fourth group of sub-signals to the seventh group of sub-signals are all correspondingly the same as the level value of the first calibration signal, so that the first impedance unit to the third first impedance unit are all disconnected. The pull-up resistance values of the fourth first impedance unit to the seventh first impedance unit are all RZQ, so that the pull-up impedance of the DM 310 is RZQ/4. Other situations may be understood by reference.

Exemplarily, in the case where M+1=4 and A=7, assuming that the valid signal between the first impedance control signal and the second impedance control signal is IMPpu_CODE[3:0], IMPpu_CODE[0] controls the first first impedance control signal, IMPpu_CODE[1] controls the second first impedance unit and the third first impedance unit, IMPpu_CODE[2] controls the fourth first impedance unit and the fifth impedance unit, and IMPpu_CODE[3] controls the sixth first impedance unit and the seventh impedance unit. Specifically, assuming that IMPpu_CODE[3:0]=1111, the level values of each group of sub-signals in the first target signal are the same as the level value of the first calibration signal, so that the pull-up resistance values of the seven first impedance units are all RZQ, and the pull-up resistance of the DM 310 is RZQ/7. Assuming that IMPpu_CODE[3:0]=1100, the level values of the first group of sub-signals to the third group of sub-signals in the first target signal are in the first level state, and the level values of each group of sub-signals in the fourth group of sub-signals to the seventh group of sub-signals are all correspondingly the same as the level value of the first calibration signal, so that the first impedance unit to the third first impedance unit are all disconnected. The pull-up resistance values of the fourth first impedance unit to the seventh first impedance unit are all RZQ, so that the pull-up impedance of the DM 310 is RZQ/4. Other situations may be understood by reference.

That is, if the level pull-up function of a certain first impedance unit is enabled, the pull-up resistance value of the first impedance unit is calibrated to the standard resistance value using the first calibration signal, otherwise if the level pull-up function of the first impedance unit is disenabled, the related circuit of the first impedance unit is disconnected using a fixed signal in the first level state.

In some embodiments, as illustrated in FIG. 7 or FIG. 8, each first impedance unit includes N first switch transistors (for example, the first switch transistor 431 in FIG. 7 or FIG. 8), N second switch transistors (for example, the second switch transistor 432 in FIG. 7 or FIG. 8) and 2N first resistors (for example, the first resistor 433 in FIG. 7 or FIG. 8). The control end of the nth first switch transistor in the ath first impedance unit is connected with the nth sub-signal in the ath group of sub-signals in the first target signal, the first end of one first switch transistor is connected with the first end of one first resistor, and the second end of one first switch transistor is connected with a power signal. The control end of one second switch transistor is connected with a second fixed level signal, the first end of one second switch transistor is connected with the ground signal VSS, the second end of one second switch transistor is connected with the first end of one first resistor, and the second ends of the 2N first resistors are all connected with the DM 310. Herein, n is less than or equal to N.

It should be understood that since the DM 310 does not support the Read function and does not need to enable the level pull-down function, the second switch transistor is turned off using the second fixed level signal, and its specific value may be determined according to the actual circuit conditions.

It is to be noted that in FIG. 7 or FIG. 8, taking the first first impedance unit as an example, the first first impedance unit is configured to receive the first group of sub-signals PU1_MAIN_CODE 1[N−1:0] in the first target signal. PU1_MAIN_CODE 1[N−1:0] includes N sub-signals of PU1_MAIN_CODE 1[0], PU1_MAIN_CODE 1[1] PU1_MAIN_CODE 1[N−1]. Each sub-signal is configured to control the working state of one first switch transistor correspondingly, so as to control the first impedance unit to perform the level pull-up function with the standard resistance value or not perform the level pull-up function.

In addition, in FIG. 7 or FIG. 8, the first impedance unit includes the three first switch transistors (only one first switch transistor 431 is numbered), three second switch transistors (only one second switch transistor 432 is numbered), and six first resistors (only one first resistor 433 is numbered), but in actual scenarios, the number of the first switch transistors/second switch transistors/first resistors may all be more or less.

It should be understood that the DM 310 only supports the data write function and provides the termination impedance, so that it is not necessary to perform the level pull-down function. Therefore, the first ends of all the second switch transistors are connected with the second fixed level signal, that is, all the second switch transistors are not conductive. Exemplarily, the second fixed level signal may be the ground signal VSS, but its specific level value needs to be determined according to the circuit logic, which is not limited in the embodiment of the present disclosure.

The specific structure description of the second driver circuit 321 is exemplarily provided below. It should be understood that although some signals in the second driver circuit 321 and some signals in the first driver circuit 311 have different Chinese names, the sources and waveforms of the signals are basically the same, so the same English names are used.

In the embodiment of the present disclosure, the semiconductor memory 30 is further configured to determine a third non-test state control signal, a fourth impedance control signal, a fifth impedance control signal, a second calibration signal ZQ2 CODE[N−1:0] and a third calibration signal ZQ3 CODE[N−1:0].

Figure 9:
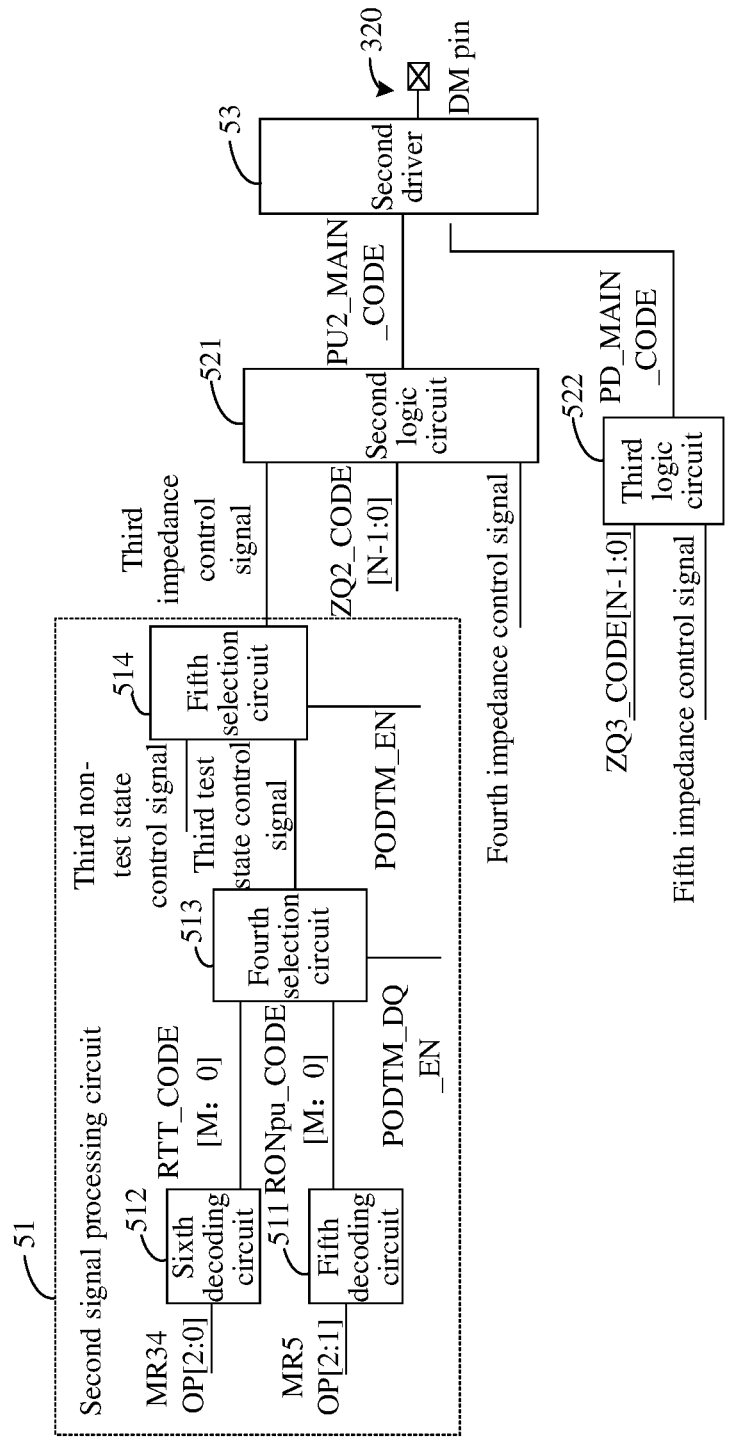
FIG. 9 is a schematic diagram of a structure of a second driver circuit according to an embodiment of the present disclosure.

As illustrated in FIG. 9, the second driver circuit 421 may include a second signal processing circuit 51, a second logic circuit 521, a third logic circuit 522, and a second driver 53.

The second signal processing circuit 51 is configured to receive the second test flag signal PODTM_DQ_EN (for example, aforementioned PODTM_DQ0_EN, or PODTM_DQ1_EN or PODTM_DQ7_EN), the first OP MR5 OP[2:1], the second OP MR34 OP[2:0] and the third non-test state control signal; and output, based on one of the first OP MR5 OP[2:1] and the second OP MR34 OP[2:0], a third impedance control signal according to the second test flag signal PODTM_DQ_EN when the semiconductor memory 30 is in the preset test mode; or, output, based on the third non-test state control signal, the third impedance control signal when the semiconductor memory 30 is not in the preset test mode.

The second logic circuit 521 is configured to receive the third impedance control signal, the fourth impedance control signal and the second calibration signal ZQ2_CODE[N−1:0]; and select and logically combine the fourth impedance control signal and the second calibration signal ZQ2_CODE[N−1:0] to output a second target signal PU2_MAIN_CODE.

The third logic circuit 522 is configured to receive the fifth impedance control signal and the third calibration signal ZQ3_CODE[N−1:0]; and logically combine the fifth impedance control signal and the third calibration signal ZQ3_CODE[N−1:0] to output a third target signal PD_MAIN_CODE.

The second driver 53 includes a plurality of second impedance units and is configured to receive the second target signal PU2_MAIN_CODE and the third target signal PD_MAIN_CODE; and control the plurality of second impedance units using the second target signal PU2_MAIN_CODE and the third target signal PD_MAIN_CODE, so as to control the impedance of the corresponding DM 320.

It is to be noted that each DQ 320 corresponds to the respective second driver circuit 321, and the embodiment of the present disclosure only takes one second driver circuit 321 as an example for explanation.

It should be understood that the DQ 320 supports the Write function and the Read function, and involves the level pull-up function and the level pull-down function at the same time. Therefore, there are not only the third impedance control signal and the third impedance control signal which are configured to control the level pull-up function in the second driver circuit 321, but also the fifth impedance control signal configured to control the level pull-down function.

It is to be noted that the second calibration signal ZQ2_CODE[N−1:0] is configured calibrate the pull-up resistance value, that is, the second calibration signal ZQ2_CODE[N−1:0] is configured to calibrate the pull-up resistance value of each second impedance unit to the standard resistance value. The third calibration signal ZQ3_CODE[N−1:0] is configured to calibrate the pull-down resistance value, that is, the third calibration signal ZQ3_CODE[N−1:0] is configured to calibrate the pull-down resistance value of each second impedance unit to the standard resistance value.

In addition, since the first calibration signal ZQ1_CODE[N−1:0] and the second calibration signal ZQ2_CODE[N−1:0] are both configured to calibrate the pull-up resistance value, in some embodiments, it may be considered that the deviations of the first impedance unit and the second impedance unit are within the allowable error range, so that the first calibration signal ZQ1_CODE[N−1:0] and the second calibration signal ZQ2_CODE[N−1:0] may be the same signal.

It is also to be noted that for the second driver circuit 321, the valid signal between the third impedance control signal and the fourth impedance control signal and the second calibration signal ZQ2_CODE[N−1:0] are combined through the second logic circuit 521, so as to form the second target signal PU2_MAIN_CODE configured to control the level pull-up function of the second impedance unit 53. The circuit structure and signal processing process of this part of the circuit may be correspondingly understood with reference to the first driver circuit 311, which is not repeated here. In addition, the second driver circuit 321 also combines the fifth impedance control signal and the third calibration signal ZQ3_CODE[N−1:0] through the third logic circuit 522, so as to form the third target signal PD_MAIN_CODE configured to control the level pull-down function of the second impedance unit 53.

In some embodiments, as illustrated in FIG. 9, the second signal processing circuit 51 may include a fifth decoding circuit 511, a sixth decoding circuit 512, a fourth selection circuit 513, and a fifth selection circuit 514.

The fifth decoding circuit 511 is configured to receive the first OP MR5 OP[2:1], decode the first OP MR5 OP[2:1] and output a third decoded signal RONpu_CODE[M:0].

The sixth decoding circuit 512 is configured to receive the second OP MR34 OP[2:0], decode the second OP MR34 OP[2:0] and output a fourth decoded signal RTT_CODE[M:0].

The fourth selection circuit 513 is configured to receive the second test flag signal PODTM_DQ_EN, the third decoded signal RONpu_CODE[M:0] and the fourth decoded signal RTT_CODE[M:0]; and select one of the third decoded signal RONpu_CODE[M:0] and the fourth decoded signal RTT_CODE[M:0] to output a third test state control signal according to the second test flag signal PODTM_DQ_EN.

The fifth selection circuit 514 is configured to receive the test enable signal PODTM_EN, the third test state control signal and the third non-test state control signal; and select one of the third test state control signal and the third non-test state control signal to output the third impedance control signal according to the test enable signal PODTM_EN. Herein, the test enable signal PODTM_EN is configured to indicate whether the semiconductor memory 30 is in the preset test mode.

For the second driver circuit 321 illustrated in FIG. 9, according to the different definitions of the third non-test state control signal and the fourth impedance control signal, there may be two specific implementation modes.

In one embodiment, the third non-test state control signal is configured to indicate the impedance of the corresponding DQ in a termination state, and the fourth impedance control signal and the fifth impedance control signal are joint configured to indicate the impedance of the corresponding DQ in the output driver state. That is, by merging the signal control strategy of the DQ in the PODTM into the signal control strategy of the write-related attribute, the impedance control of the PODTM is realized.

Figure 10:
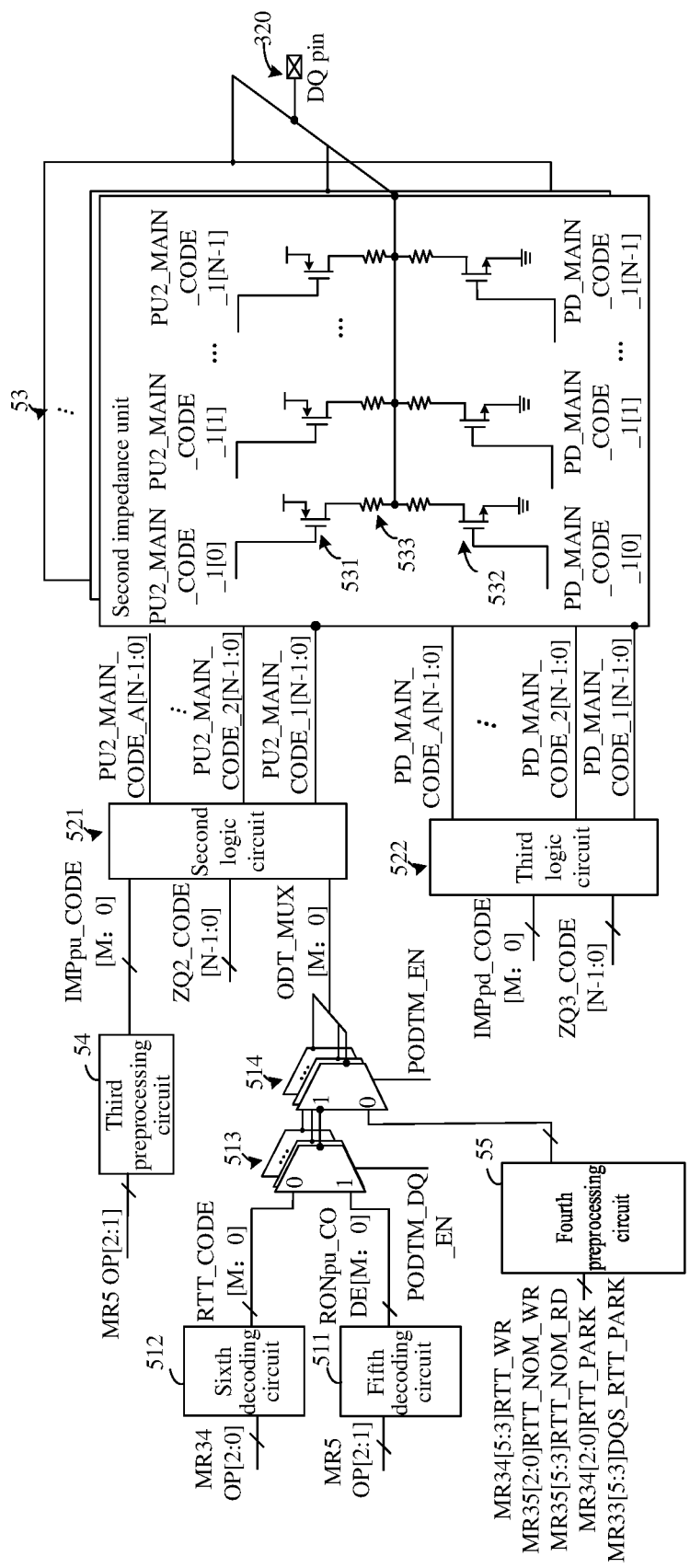
FIG. 10 is a first schematic diagram of a detailed structure of a second driver circuit according to an embodiment of the present disclosure.

Correspondingly, as illustrated in FIG. 10, the third impedance control signal is represented by ODT_MUX[M:0], the fourth impedance control signal is represented by IMPpu_CODE[M:0], and the fifth impedance control signal is represented by IMPpd_CODE[M:0]. Particularly, compared with FIG. 9, the second driver circuit 321 in FIG. 10 further includes a third preprocessing circuit 54 and a fourth preprocessing circuit 55. The third preprocessing circuit 54 is configured to decode the first OP MR5 OP[2:1] to obtain the fourth impedance control signal IMPpu_CODE[M:0]. The fourth preprocessing circuit 55 is configured to determine the third non-test state control signal according to MR34[5:3] involving RTT_WR, MR35[2:0] involving RTT_NOM_WR, MR35[5:3] involving RTT_NOM_RD, MR34[2:0] involving RTT_PARK, and MR33[5:3] involving DQS_RTT_PARK. In addition, in the following description, if the semiconductor memory 30 is in the PODTM, the test enable signal PODTM_EN is logic "1". If the corresponding DQ 320 is the test object of the PODTM, the corresponding first test flag signal PODTM_DQ_EN is logic "1".

Here, the basic working principle of the second driver circuit 321 in FIG. 10 is substantially the same as that of the first driver circuit 311 in FIG. 7, which may be understood with reference to the foregoing description of FIG. 7 and may not repeated in this embodiment of the present disclosure. Particularly, since the DQ 320 is generally enabled in the normal working mode, the signal configured to control whether to enable the DQ 320 is not set in the DDR5 SPEC, so that compared with the first driver circuit 311 in FIG. 7, the second driver circuit 321 in FIG. 10 has one less selection circuit. In addition, compared with the first driver circuit 311 in FIG. 7, the second driver circuit 321 in FIG. 10 has one more control part of the level pull-down impedance, and its signal processing principle may refer to the following description.

In another embodiment, the third non-test state control signal and the fifth non-test state control signal are jointly configured to indicate the impedance of the corresponding DQ in the output driver state, and the fourth impedance control signal is configured to indicate the impedance of the corresponding DQ in the termination state. That is, by merging the signal control strategy of the DQ in the PODTM into the signal control strategy of the read-related attribute, the impedance control of the PODTM is realized.

Figure 11:
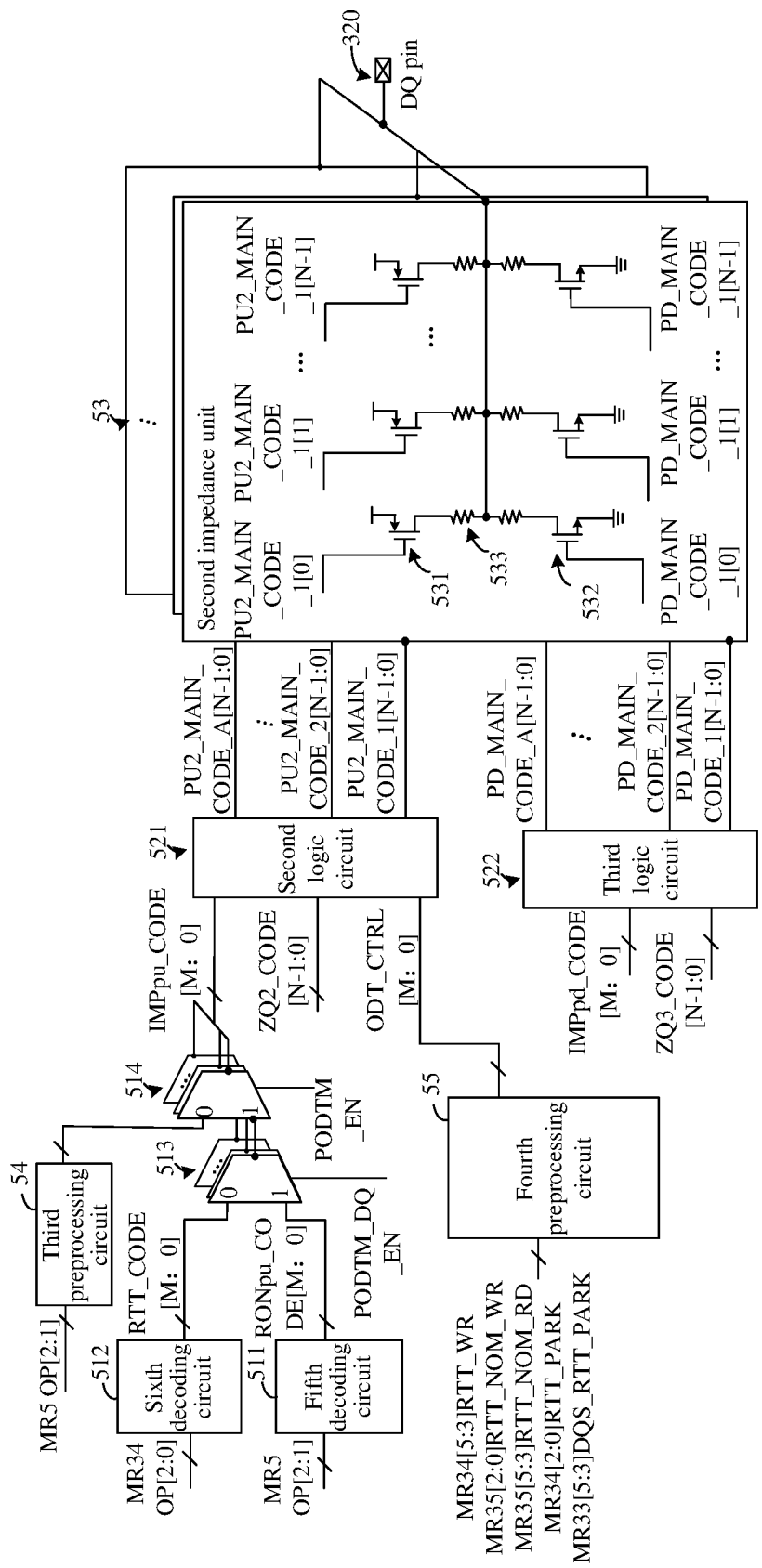
FIG. 11 is a second schematic diagram of a detailed structure of a second driver circuit according to an embodiment of the present disclosure.

Correspondingly, as illustrated in FIG. 11, the third impedance control signal is represented by IMPpu_CODE[M:0], the fourth impedance control signal is represented by ODT_CTRL[M:0], and the fifth impedance control signal is represented by IMPpd_CODE[M:0]. Particularly, compared with FIG. 9, the semiconductor memory 30 in FIG. 11 also includes the third preprocessing circuit 54 and the fourth preprocessing circuit 55.

Here, the working principle of the second driver circuit 321 in FIG. 11 is substantially the same as that of the first driver circuit 311 in FIG. 8, which may be correspondingly understood with reference to the foregoing description of FIG. 8 and may not repeated in this embodiment of the present disclosure. Similarly, compared with the second driver circuit 321 in FIG. 11, the first driver circuit 311 in FIG. 8 has one less selection circuit. Compared with the first driver circuit 311 in FIG. 8, the second driver circuit 321 in FIG. 11 has one more control part of the level pull-down impedance, and its signal processing principle may refer to the following description.

The signal processing process in the second driver circuit 321 will be described below with reference to FIG. 10 or FIG. 11.

In some embodiments, each of the third decoded signal RONpu_CODE[M:0], the fourth decoded signal RTT_CODE[M:0], the third test state control signal, the third non-test state control signal and the third impedance control signal includes an (M+1)-bit sub-signal. The fourth selection circuit 513 includes (M+1) fourth data selectors. The fifth selection circuit 514 includes (M+1) fifth data selectors. Herein, the input end of one fourth data selector receives a 1-bit sub-signal of the third decoded signal RONpu_CODE[M:0] and a 1-bit sub-signal of the fourth decoded signal RTT_CODE[M:0], the output end of one fourth data selector is configured to output a 1-bit sub-signal of the third test state control signal, and the control ends of all the fourth data selectors receive the second test flag signal PODTM_DQ_EN. The input end of one fifth data selector receives the 1-bit sub-signal of the third test state control signal and a 1-bit sub-signal of the third non-test state control signal, the output end of one fifth data selector is configured to output a 1-bit sub-signal of the third impedance control signal, and the control ends of all the fifth data selectors receive the test enable signal PODTM_EN.

It is to be noted that the third test state control signal is represented as the third test state control signal [M:0], the third non-test state control signal is represented as the third non-test state control signal [M:0], and the third impedance control signal is represented as the third impedance control signal [M:0]. In this way, the first fourth data selector receives RONpu_CODE[0], RTT_CODE[0] and PODTM_DQ_EN respectively, and selects one of RONpu_CODE[0] and RTT_CODE[0] to output the third test state control signal [0] according to PODTM_DQ_EN. The first fifth data selector receives the third test state control signal [0], the third non-test state control signal [0] and PODTM_EN respectively, and selects one of the third test state control signal [0] and the third non-test state control signal [0] to output the third impedance control signal [0] according to PODTM_EN. Others may be understood by reference and analogy.

In some embodiments, the fourth impedance control signal includes an (M+1)-bit sub-signal. The second calibration signal ZQ2_CODE[N−1:0] and the third calibration signal ZQ3_CODE[N−1:0] include N-bit sub-signals. The second target signal PU2_MAIN_CODE and the third target signal PD_MAIN_CODE include A group of sub-signals. Each group of sub-signals includes N-bit sub-signals. Here, the second driver 53 includes A second impedance units, and each second impedance unit is configured to receive a group of sub-signals in the second target signal PU2_MAIN_CODE and a group of sub-signals in the third target signal PD_MAIN_CODE. That is, the first second impedance unit is configured to receive PU2_MAIN_CODE 1[N−1:0] and PD_MAIN_CODE 1[N−1:0], and the second second impedance unit is configured to receive PU2_MAIN_CODE 2[N−1:0] and PD_MAIN_CODE 2[N−1:0] the Ath second impedance unit is configured to receive PU2_MAIN_CODE_A[N−1:0] and PD_MAIN_CODE_A[N−1:0].

Herein, the second logic circuit 521 is specifically configured to determine whether the level pull-up function of the at least one second impedance unit is enabled according to the third impedance control signal and the fourth impedance control signal; and determine, in the case where the level pull-up function of the ath second impedance unit is enabled, the level state of the ath group of sub-signals in the second target signal PU2_MAIN_CODE according to the second calibration signal ZQ2_CODE[N−1:0], so as to control the resistance value of the second impedance unit to be a standard resistance value; or, determine, in the case where the level pull-up function of the ath second impedance unit is disabled, that the ath group of sub-signals in the second target signal PU2_MAIN_CODE are in the first level state. The third logic circuit 522 is specifically configured to determine whether the level pull-up function of the at least one second impedance unit is enabled according to the fifth impedance control signal; and determine, in the case where the level pull-down function of the ath second impedance unit is enabled, the level state of the ath group of sub-signals in the third target signal PD_MAIN_CODE according to the third calibration signal ZQ3_CODE[N−1:0], so as to control the resistance value of the second impedance unit to be a standard resistance value; or, determine, in the case where the level pull-down function of the ath second impedance unit is disabled, that the ath group of sub-signals in the third target signal PD_MAIN_CODE are in the second level state.

It is to be noted that the valid signal between the third impedance control signal and the fourth impedance control signal and the second calibration signal ZQ2_CODE[N−1:0] are combined through the second logic circuit 521, so as to obtain the second target signal PU2_MAIN_CODE, thereby controlling the level pull-up function of the second impedance unit. The structure and function of the second logic circuit 521 are substantially the same as those of the first logic circuit 42, and the working principle of the second logic circuit 521 may refer to the above description of the first logic circuit 42 and may not be repeated here.

The third logic circuit 533 is configured to combine the fifth impedance control signal IMPpd_CODE[M:0] and the third calibration signal ZQ3_CODE[N−1:0] to obtain the third target signal PD_MAIN_CODE, so as to control the level pull-down function of the second impedance unit. Similarly, the 1-bit sub-signal of the fifth impedance control signal IMPpd_CODE[M:0] controls whether the level pull-down function of one or more second impedance units is enabled. On this basis, if the level pull-down function of a certain second impedance unit function is enabled, the pull-down resistance value of the second impedance unit is calibrated to the standard resistance value using the third calibration signal ZQ3_CODE[N−1:0], so that the level pull-down function is performed, otherwise if the level pull-down function of the second impedance unit is disenabled, the related circuit of the second impedance unit is disconnected using a fixed signal in the second level state.

In some embodiments, each second impedance unit includes N third switch transistors (for example, the third switch transistor 531 in FIG. 10 or FIG. 11), N fourth switch transistors (for example, the fourth switch transistor 532 in FIG. 10 or FIG. 11) and 2N second resistors (for example, the second resistor 533 in FIG. 10 or FIG. 11). The control end of the nth second switch transistor in the ath third impedance unit is connected with the nth sub-signal in the ath group of sub-signals in the second target signal, the first end of one third switch transistor is connected with the first end of one second resistor, and the second end of one third switch transistor is connected with a power signal. The control end of the nth fourth switch transistor in the ath second impedance unit is connected with the nth sub-signal in the ath group of sub-signals in the third target signal, the first end of one fourth switch transistor is connected with the ground signal, the second end of one fourth switch transistor is connected with the first end of one second resistor, and the second ends of the 2N second resistors are all connected with the DQ.

It is to be noted that in FIG. 10 or FIG. 11, taking the first second impedance unit as an example, the first second impedance unit is configured to receive the first group of sub-signals PU2_MAIN_CODE 1[N−1:0] in the second target signal and the first group of sub-signals PD_MAIN_CODE 1[N−1:0] in the third target signal. Herein, PU2_MAIN_CODE 1[N−1:0] includes sub-signals of PU2_MAIN_CODE 1[0], PU2_MAIN_CODE 1[1] PU2_MAIN_CODE 1[N−1], and each sub-signal is configured to correspondingly control the working state of one third switch transistor, so as to control the second impedance unit to perform the level pull-up function with the standard resistance value or not perform the level pull-up function. PD_MAIN_CODE 1[N−1:0] includes sub-signals of PD_MAIN_CODE 1[0], PD_MAIN_CODE 1[1] PD_MAIN_CODE 1[N−1], and sub-signal is configured to correspondingly control the working state of one fourth switch transistor, so as to control the second impedance unit to perform the level pull-down function with the standard resistance value or not perform the level pull-down function.

In addition, in FIG. 10 or FIG. 11, the first second impedance unit includes the three third switch transistors (only one third switch transistor 531 is numbered), three fourth switch transistors (only one fourth switch transistor 532 is numbered) and six second resistors (only one second resistor 533 is numbered), but in actual scenarios, the number of the third switch transistors/fourth switch transistors/second resistors may all be more or less.

In the feasible circuit logic, the first level state is a high level state (logic "1"), and the second level state is a low level state (logic "0"). The high-level state refers to a level value which makes a N-channel field effect transistor be conductive or a P-channel field effect transistor be non-conductive. The low-level state refers to a level value which makes the N-channel field effect transistor non-conductive or the P-channel field effect transistor conductive. The sub-signals in the first fixed level signal are all high level signals, and the second fixed level signal is a low level signal. Here, the selection of the first fixed level signal and the second fixed level signal is determined according to the circuit logic, the first fixed level signal may be the power signal VDD, and the second fixed level signal may be the ground signal VSS.

The first switch transistor and the third switch transistor are both P-channel field effect transistors, and the second switch transistor and the fourth switch transistor are both N-channel field effect transistors. The control end of the P-channel field effect transistor is a gate, the second end of the P-channel field effect transistor is a source, and the first end of the P-channel field effect transistor is a drain. The control end of the N-channel field effect transistor is the gate, the second end of the N-channel field effect transistor is the drain, and the first end of the N-channel field effect transistor is the source. The standard resistance value is 240 ohms.

The embodiments of the present disclosure provide the semiconductor memory. since both the third OP and the fourth OP may affect the impedance state of the DM to avoid the circuit processing errors, the following impedance control strategy is provided: if the fourth OP is in the first state, the impedance of the DM is determined in combination with the state of the third OP, and if the fourth OP is in the second state, the impedance of the DM is directly determined. In this way, the impedance of the DM may be tested in the preset test mode to avoid the circuit processing errors. The relation between the control signal, which is configured to control whether to enable the DM, in the DDR5 and the control signal, which is configured to control whether the DM is the test object, in the PODTM is specified. The impedance of the DM may be tested in the preset test mode to avoid the circuit processing errors.

Figure 12:
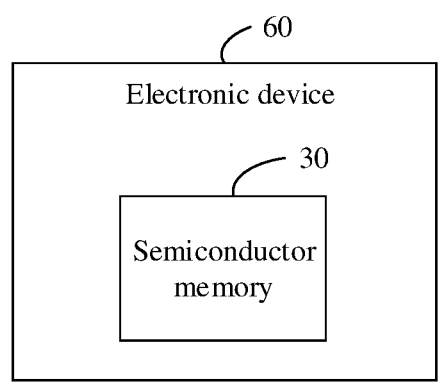
FIG. 12 is a schematic diagram of a composition structure of an electric device according to an embodiment of the present disclosure.

In another embodiment of the present disclosure, referring to FIG. 12, which illustrates a schematic diagram of a composition structure of an electronic device 60 according to an embodiment of the present disclosure. As illustrated in FIG. 12, the electronic device 60 may include the semiconductor memory 30 described in any one of the foregoing embodiments.

In the embodiment of the present disclosure, the semiconductor memory 30 may be a DRAM chip.

Further, in some embodiments, the DRAM chip conforms to the memory specification of DDR5.

The embodiments of the present disclosure mainly relate to a control method and a related control circuit for the DM of the semiconductor memory. The impedance control strategy for the DM in the preset test mode is provided. The impedance of the DM may be tested in the preset test mode to avoid the circuit processing errors.

The above are only the preferred embodiments of the present disclosure, and are not intended to limit the scope of protection of the present disclosure.

It is to be noted that in this disclosure, the terms "including", "containing" or any other variation thereof are intended to cover non-exclusive inclusion, so that a process, method, article or device including a series of elements includes not only those elements, but also other elements not explicitly listed, or elements inherent to the process, method, article or device. Without more restrictions, an element defined by the sentence "including a . . . " does not exclude the existence of other identical elements in the process, method, article, or device including the element.

The above numbers of the embodiments of the present disclosure are only for description, and do not represent the advantages or disadvantages of the embodiments.

The methods disclosed in the several method embodiments provided in the present disclosure may be combined arbitrarily without conflict to obtain new method embodiments.

The features disclosed in the several product embodiments provided in the present disclosure may be combined arbitrarily without conflict to obtain new product embodiment.

The features disclosed in several method or device embodiments provided in the present disclosure may be combined arbitrarily without conflict to obtain new method embodiments or device embodiments.

The above are only the specific implementation modes of the present disclosure and not intended to limit the scope of protection of the present disclosure. Any variations or replacements apparent to those skilled in the art within the technical scope disclosed by the disclosure shall fall within the scope of protection of the present disclosure. Therefore, the scope of protection of the present disclosure shall be subject to the scope of protection of the claims.

Embodiments of the present disclosure provide a control method, a semiconductor memory, and an electronic device. An impedance control strategy for the DM in the preset test mode is provided, so that the impedance of the DM in the preset test mode may be defined. In addition, the relation between a control signal configured to control whether to enable the DM in the DDR5 and a control signal configured to control whether the DM is a test object in the PODTM is specified. The impedance of the DM may be tested in the preset test mode to avoid circuit processing errors.

What is claimed is:

1. A control method, applied to a semiconductor memory, the semiconductor memory comprising a Data Mask (DM) pin, wherein the DM pin is used for receiving an input mask signal, the input mask signal is a signal for controlling writing data into the semiconductor memory, and the method comprises:
   in response to that the semiconductor memory is in a preset test mode,
      when a fourth Operand (OP) in a first Model Register (MR) indicates to enable the DM pin, controlling an impedance of the DM pin to be a first impedance parameter or a second impedance parameter according to a third OP in a third MR, wherein the third OP indicates whether the DM pin is to be tested in the preset test mode; or
      when the fourth OP in the first MR indicates not to enable the DM pin, controlling the impedance of the DM pin to be in a high impedance state.

2. The control method according to claim 1, wherein controlling the impedance of the DM pin to be the first impedance parameter or the second impedance parameter according to the third OP in the third MR comprises:

when the third OP indicates that the DM pin is to be tested in the preset test mode, controlling the impedance of the DM pin to be the first impedance parameter through a first OP in the first MR;

when the third OP indicates that the DM pin is not to be tested in the preset test mode, controlling the impedance of the DM pin to be the second impedance parameter through a second OP in a second MR;

wherein the semiconductor memory further comprises at least one data pin, the data pin is configured to receive or output data, the first OP is configured to indicate that an impedance of the at least one data pin in an output driver state is the first impedance parameter, and the second OP is configured to indicate that the impedance of the at least one data pin in a termination state is the second impedance parameter.

3. The control method according to claim 2, wherein the method further comprises:

acquiring the first OP and the fourth OP stored in the first MR, the second OP stored in the second MR, and the third OP stored in the third MR;

decoding the third OP and the fourth OP respectively to obtain a first test flag signal and an enable control signal; and in response to that the semiconductor memory is in the preset test mode, selecting, in a case where the enable control signal is in a first level state, the first OP or the second OP to control the impedance of the DM pin according to a level state of the first test flag signal; or controlling, in a case where the enable control signal is in a second level state, the DM pin to be in the high impedance state through a first fixed level signal;

wherein when the fourth OP indicates to enable the DM pin, the enable control signal is in the first level state; when the fourth OP indicates not to enable the DM pin, the enable control signal is in the second level state; when the third OP indicates that the DM pin is to be tested in the preset test mode, the first test flag signal is in the first level state; and when the third OP indicates that the DM pin is not to be tested in the preset test mode, the first test flag signal is in the second level state.

4. The control method according to claim 3, wherein the method further comprises:

determining a first non-test state control signal and a second impedance control signal;

in response to that the semiconductor memory is in the preset test mode, outputting, based on one of the first fixed level signal, the first OP and the second OP, a first impedance control signal according to the level state of the first test flag signal and a level state of the enable control signal; or in response to that the semiconductor memory is not in the preset test mode, outputting, based on the first non-test state control signal, the first impedance control signal; and selecting one of the first impedance control signal and the second impedance control signal to control the impedance of the DM pin according to a working state of the semiconductor memory;

wherein the first non-test state control signal is configured to indicate an impedance of the DM pin in a state except the preset test state, and the second impedance control signal is configured to indicate an impedance of the data pin in the output driver state; or the first non-test state control signal is configured to indicate the impedance of the data pin in the output driver state, and the second impedance control signal is configured to indicate the impedance of the DM pin in the state except the preset test state.

5. The control method according to claim 3, wherein the preset test mode refers to a Package Output Driver Test Mode (PODTM), and the PODTM is configured to test the impedance of the DM pin or the at least one data pin after packaging;

a standard number of the first MR is 5, the first OP refers to an OP from a second bit to a first bit stored in the first MR, and the fourth OP refers to an OP at a fifth bit stored in the first MR; a standard number of the second MR is 34, and the second OP refers to an OP from a second bit to a 0th bit stored in the third MR; a standard number of the third MR is 61, and the third OP refers to an OP from a 4th bit to a 0th bit stored in the third MR; and the first level state is a high level state, and the second level state is a low level state.

6. A semiconductor memory, comprising a Data Mask (DM) pin, a first Model Register (MR), a third MR, and a first driver circuit, the first driver circuit being connected with the first MR, the third MR and the DM pin respectively; wherein the DM pin is used for receiving an input mask signal, and the input mask signal is a signal for controlling writing data into the semiconductor memory;

the first driver circuit is configured to, in response to that the semiconductor memory is in a preset test mode, when a fourth Operand (OP) in the first MR indicates to enable the DM pin, control an impedance of the DM pin to be a first impedance parameter or a second impedance parameter according to a third OP in the third MR, wherein the third OP indicates whether the DM pin is to be tested in the preset test mode; or when the fourth OP in the first MR indicates not to enable the DM pin, control the impedance of the DM pin to be in a high impedance state.

7. The semiconductor memory according to claim 6, wherein the semiconductor memory further comprises a second MR, and the second MR is connected with the first driver circuit;

the first driver circuit is specifically configured to:

where when the fourth OP indicates to enable the DM pin and the third OP indicates that the DM pin is to be tested in the preset test mode, control the impedance of the DM pin to be the first impedance parameter through a first OP in the first MR;

when the fourth OP indicates to enable the DM pin and the third OP indicates that the DM pin is not to be tested in the preset test mode, control the impedance of the DM pin to be the second impedance parameter through a second OP in the second MR; or where when the fourth OP indicates not to enable the DM pin, control the impedance of the DM pin to be in the high impedance state according to a first fixed level signal;

wherein the semiconductor memory further comprises at least one data pin, the data pin is configured to receive or output data, the first OP is configured to indicate that an impedance of the at least one data pin in an output driver state is the first impedance parameter, and the second OP is configured to indicate that an impedance of the at least one data pin in a termination state is the second impedance parameter.

8. The semiconductor memory according to claim 7, wherein the semiconductor memory further comprises a first decoding circuit and a second decoding circuit; wherein the first MR is configured to store and output the first OP and the fourth OP;

the second MR is configured to store and output the second OP;

the third MR is configured to store and output the third OP;

the first decoding circuit is configured to receive the third OP, decode the third OP and output a first test flag signal;

the second decoding circuit is configured to receive the fourth OP, decode the fourth OP and output an enable control signal;

the first driver circuit is configured to:

receive the enable control signal, the first test flag signal, the first fixed level signal, the first OP and the second OP; and in response to that the semiconductor memory is in the preset test mode, control, in a case where the enable control signal is in a first level state, the impedance of the DM pin based on the first OP or the second OP according to a level state of the first test flag signal; or control, in a case where the enable control signal is in a second level state, the DM pin to be in the high impedance state through the first fixed level signal;

wherein when the fourth OP indicates to enable the DM pin, the enable control signal is in the first level state; when the fourth OP indicates not to enable the DM pin, the enable control signal is in the second level state; when the third OP indicates that the DM pin is to be tested in the preset test mode, the first test flag signal is in the first level state; and when the third OP indicates that the DM pin is not to be tested in the preset test mode, the first test flag signal is in the second level state.

9. The semiconductor memory according to claim 8, wherein the semiconductor memory is further configured to determine a first non-test state control signal, a second impedance control signal and a first calibration signal; wherein the first calibration signal is configured to calibrate a pull-up resistance value, and the first driver circuit comprises:

a first signal processing circuit, configured to receive the first test flag signal, the enable control signal, the first fixed level signal, the first OP, the second OP and the first non-test state control signal; and output, based on one of the first fixed level signal, the first OP and the second OP, a first impedance control signal according to the level state of the first test flag signal and a level state of the enable control signal in response to that the semiconductor memory is in the preset test mode; or output, based on the first non-test state control signal, the first impedance control signal in response to that the semiconductor memory is not in the preset test mode;

a first logic circuit, configured to receive the first impedance control signal, the second impedance control signal and the first calibration signal; and select and logically combine the first impedance control signal, the second impedance control signal and the first calibration signal to output a first target signal; and a first driver, comprising a plurality of first impedance units and configured to receive the first target signal, and control the plurality of first impedance units by using the first target signal, so as to control the impedance of the DM pin;

wherein the first non-test state control signal is configured to indicate an impedance of the DM pin in a state except the preset test state, and the second impedance control signal is configured to indicate an impedance of the data pin in the output driver state; or the first non-test state control signal is configured to indicate the impedance of the data pin in the output driver state, and the second impedance control signal is configured to indicate the impedance of the DM pin in the state except the preset test state.

10. The semiconductor memory according to claim 9, wherein the first signal processing circuit comprises:

a third decoding circuit, configured to receive the first OP, decode the first OP and output a first decoded signal;

a fourth decoding circuit, configured to receive the second OP, decode the second OP and output a second decoded signal;

a first selection circuit, configured to receive the first test flag signal, the first decoded signal and the second decoded signal; and select, according to the first test flag signal, one of the first decoded signal and the second decoded signal to output a first preselection signal;

a second selection circuit, configured to receive the enable control signal, the first preselection signal and the first fixed level signal; and select, according to the level state of the enable control signal, one of the first preselection signal and the first fixed level signal to output a first test state control signal; and a third selection circuit, configured to receive the test enable signal, the first test state control signal and the first non-test state control signal; and select, according to the level state of the test enable signal, one of the first test state control signal and the first non-test state control signal to output the first impedance control signal; wherein the test enable signal is configured to indicate whether the semiconductor memory is in the preset test mode.

11. The semiconductor memory according to claim 10, wherein each of the first decoded signal, the second decoded signal, the first preselection signal, the first fixed level signal, the first test state control signal, the first non-test state control signal and the first impedance control signal comprises an (M+1)-bit sub-signal, the first selection circuit comprises (M+1) first data selectors, the second selection circuit comprises (M+1) second data selectors, and the third selection circuit comprises (M+1) third data selectors; wherein an input end of one first data selector receives a 1-bit sub-signal of the first decoded signal and a 1-bit sub-signal of the second decoded signal, an output end of one first data selector is configured to output a 1-bit sub-signal of the first preselection signal, and control ends of all the first data selectors receive the first test flag signal;

an input end of one second data selector receives the 1-bit sub-signal of the first preselection signal and a 1-bit sub-signal of the first fixed level signal, an output end of one second data selector is configured to output a 1-bit sub-signal of the first test state control signal, and control ends of all the second data selectors receive the enable control signal;

an input end of one third data selector receives a 1-bit sub-signal of the first test state signal and a 1-bit sub-signal of the first non-test state control signal, an output end of one third data selector is configured to output a 1-bit sub-signal of the first impedance control signal, and control ends of all the third data selectors receive the test enable signal;

wherein M is a positive integer.

12. The semiconductor memory according to claim 11, wherein the second impedance control signal comprises an (M+1)-bit sub-signal, the first calibration signal comprises N-bit sub-signals, the first target signal comprises A groups of sub-signals, and each group of sub-signals comprises N-bit sub-signals; the first driver comprises A first impedance units, and each first impedance unit is configured to receive a group of sub-signals in the first target signal;

the first logic circuit is specifically configured to determine whether the level pull-up function of the at least one first impedance unit is enabled according to the first impedance control signal and the second impedance control signal; and determine, in a case where an level pull-up function of an ath first impedance unit is enabled, a level state of an ath group of sub-signals in the first target signal according to the first calibration signal, so as to control the resistance value of the ath first impedance unit to be a standard resistance value; or determine, in a case where the level pull-up function of the ath first impedance unit is disabled, that the ath group of sub-signals in the first target signal are in the first level state;

wherein a, N and A are all integers, a is less than or equal to A, and (M+1) is less than or equal to A.

13. The semiconductor memory according to claim 12, wherein each first impedance unit comprises N first switch transistors, N second switch transistors and 2N first resistors;

a control end of an nth first switch transistor in an ath first impedance unit is connected with an nth sub-signal in the ath group of sub-signals in the first target signal, a first end of one first switch transistor is connected with a first end of one first resistor, and a second end of one first switch transistor is connected with a power signal;

a control end of one second switch transistor is connected with a second fixed level signal, a first end of one second switch transistor is connected with a ground signal, a second end of one second switch transistor is connected with the first end of one first resistor, and second ends of 2N first resistors are all connected with the DM pin;

wherein n is an integer, and n is less than or equal to N.

14. The semiconductor memory according to claim 13, wherein the first switch transistor is a P-channel field effect transistor, and the second switch transistor is an N-channel field effect transistor; a control end of the P-channel field effect transistor is a gate, a second end of the P-channel field effect transistor is a source, a first end of the P-channel field effect transistor is a drain, a control end of the N-channel field effect transistor is a gate, a second end of the N-channel field effect transistor is a drain, and a first end of the N-channel field effect transistor is a source;

the first level state is a high level state, the second level state is a low level state, sub-signals in the first fixed level signal are high-level signals, and the second fixed level signal is a low-level signal; and a standard resistance value is 240 ohms.

15. An electronic device, comprising a semiconductor memory, wherein the semiconductor memory comprises a Data Mask (DM) pin, a first Model Register (MR), a third MR, and a first driver circuit, the first driver circuit is connected with the first MR, the third MR and the DM pin respectively; wherein the DM pin is used for receiving an input mask signal, and the input mask signal is a signal for controlling writing data into the semiconductor memory;

the first driver circuit is configured to, in response to that the semiconductor memory is in a preset test mode, when a fourth Operand (OP) in the first MR indicates to enable the DM pin, control an impedance of the DM pin to be a first impedance parameter or a second impedance parameter according to a third OP in the third MR, wherein the third OP indicates whether the DM pin is to be tested in the preset test mode; or when the fourth OP in the first MR indicates not to enable the DM pin, control the impedance of the DM pin to be in a high impedance state.

16. The electronic device according to claim 15, wherein the semiconductor memory further comprises a second MR, and the second MR is connected with the first driver circuit;

the first driver circuit is specifically configured to:

when the fourth OP is indicates to enable the DM pin and the third OP indicates that the DM pin is to be tested in the preset test mode, control the impedance of the DM pin to be the first impedance parameter through a first OP in the first MR;

when the fourth OP indicates to enable the DM pin and the third OP state indicates that the DM pin is not to be tested in the preset test mode, control the impedance of the DM pin to be the second impedance parameter through a second OP in the second MR; or when the fourth OP indicates not to enable the DM pin, control the impedance of the DM pin to be in the high impedance state according to a first fixed level signal;

wherein the semiconductor memory further comprises at least one data pin, the data pin is configured to receive or output data, the first OP is configured to indicate that an impedance of the at least one data pin in an output driver state is the first impedance parameter, and the second OP is configured to indicate that an impedance of the at least one data pin in a termination state is the second impedance parameter.

17. The electronic device according to claim 16, wherein the semiconductor memory further comprises a first decoding circuit and a second decoding circuit; wherein the first MR is configured to store and output the first OP and the fourth OP;

the second MR is configured to store and output the second OP;

the third MR is configured to store and output the third OP;

the first decoding circuit is configured to receive the third OP, decode the third OP and output a first test flag signal;

the second decoding circuit is configured to receive the fourth OP, decode the fourth OP and output an enable control signal;

the first driver circuit is configured to:

receive the enable control signal, the first test flag signal, the first fixed level signal, the first OP and the second OP; and in response to that the semiconductor memory is in the preset test mode, control, in a case where the enable control signal is in a first level state, the impedance of the DM pin based on the first OP or the second OP according to a level state of the first test flag signal; or control, in a case where the enable control signal is in a second level state, the DM pin to be in the high impedance state through the first fixed level signal;

wherein when the fourth OP indicates to enable the DM pin, the enable control signal is in the first level state; when the fourth OP indicates not to enable the DM pin, the enable control signal is in the second level state; when the third OP indicates that the DM pin is to be tested in the preset test mode, the first test flag signal is in the first level state; and when the third OP indicates that the DM pin is not to be tested in the preset test mode, the first test flag signal is in the second level state.

18. The electronic device according to claim 17, wherein the semiconductor memory is further configured to determine a first non-test state control signal, a second impedance control signal and a first calibration signal; wherein the first calibration signal is configured to calibrate a pull-up resistance value, and the first driver circuit comprises:

a first signal processing circuit, configured to receive the first test flag signal, the enable control signal, the first fixed level signal, the first OP, the second OP and the first non-test state control signal; and output, based on one of the first fixed level signal, the first OP and the second OP, a first impedance control signal according to the level state of the first test flag signal and a level state of the enable control signal in response to that the semiconductor memory is in the preset test mode; or output, based on the first non-test state control signal, the first impedance control signal in response to that the semiconductor memory is not in the preset test mode;

a first logic circuit, configured to receive the first impedance control signal, the second impedance control signal and the first calibration signal; and select and logically combine the first impedance control signal, the second impedance control signal and the first calibration signal to output a first target signal; and a first driver circuit, comprising a plurality of first impedance units and configured to receive the first target signal, and control the plurality of first impedance units by using the first target signal, so as to control the impedance of the DM pin;

wherein the first non-test state control signal is configured to indicate an impedance of the DM pin in a state except the preset test state, and the second impedance control signal is configured to indicate an impedance of the data pin in the output driver state; or the first non-test state control signal is configured to indicate the impedance of the data pin in the output driver state, and the second impedance control signal is configured to indicate the impedance of the DM pin in the state except the preset test state.

19. The electronic device according to claim 18, wherein the first signal processing circuit comprises:

a third decoding circuit, configured to receive the first OP, decode the first OP and output a first decoded signal;

a fourth decoding circuit, configured to receive the second OP, decode the second OP and output a second decoded signal;

a first selection circuit, configured to receive the first test flag signal, the first decoded signal and the second decoded signal; and select, according to the first test flag signal, one of the first decoded signal and the second decoded signal to output a first preselection signal;

a second selection circuit, configured to receive the enable control signal, the first preselection signal and the first fixed level signal; and select, according to the level state of the enable control signal, one of the first preselection signal and the first fixed level signal to output a first test state control signal; and a third selection circuit, configured to receive the test enable signal, the first test state control signal and the first non-test state control signal; and select, according to the level state of the test enable signal, one of the first test state control signal and the first non-test state control signal to output the first impedance control signal; wherein the test enable signal is configured to indicate whether the semiconductor memory is in the preset test mode.

20. The control method according to claim 1, wherein the first impedance parameter is a pull-up output driver impedance, and a value of the pull-up output driver impedance is determined based on a first OP in the first MR; and wherein the second impedance parameter is a termination impedance, a value of the termination impedance is determined based on a second OP in a second MR.

* * * * *